(12) United States Patent
Jeong

(10) Patent No.: US 8,598,615 B2
(45) Date of Patent: Dec. 3, 2013

(54) LIGHT EMITTING DEVICE, METHOD FOR FABRICATING THE LIGHT EMITTING DEVICE, LIGHT EMITTING DEVICE PACKAGE AND LIGHTING SYSTEM

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/280,573

(22) Filed: Oct. 25, 2011

(65) Prior Publication Data

US 2012/0037949 A1 Feb. 16, 2012

(30) Foreign Application Priority Data

Oct. 25, 2010 (KR) .................. 10-2010-0104232
Oct. 29, 2010 (KR) .................. 10-2010-0107293
Oct. 29, 2010 (KR) .................. 10-2010-0107294

(51) Int. Cl.
   *H01L 33/00* (2010.01)
(52) U.S. Cl.
   USPC .............................. 257/99; 257/98
(58) Field of Classification Search
   USPC ...................................... 257/99, 98
   See application file for complete search history.

(56) References Cited

U.S. PATENT DOCUMENTS

2007/0181895 A1* 8/2007 Nagai ............................. 257/98

* cited by examiner

*Primary Examiner* — Douglas Menz
(74) *Attorney, Agent, or Firm* — Ked & Associates, LLP

(57) ABSTRACT

Provided is a light emitting device. The light emitting device includes a light emitting structure layer including a first conductive type semiconductor layer, a second conductive type semiconductor layer, and an active layer between the first conductive type semiconductor layer and the second conductive type semiconductor layer, a first electrode electrically connected to the first conductive type semiconductor layer, an insulating support member under the light emitting structure layer, and a plurality of conductive layers between the light emitting structure layer and the insulating support member. At least one of the plurality of conductive layers has a width greater than that of the light emitting structure layer and includes a contact part disposed further outward from a sidewall of the light emitting structure layer.

22 Claims, 16 Drawing Sheets

LIGHT EMITTING DEVICE, METHOD FOR FABRICATING THE LIGHT EMITTING DEVICE, LIGHT EMITTING DEVICE PACKAGE AND LIGHTING SYSTEM

CROSS-REFERENCE TO RELATED APPLICATIONS

The present application claims priority under 35 U.S.C. §119(a) from Korean Patent Application Nos. 10-2010-0104232, filed Oct. 25, 2010, 10-2010-0107293, filed Oct. 29, 2010, and 10-2010-0107294, filed Oct. 29, 2010, the subject matters of which are hereby incorporated by reference.

BACKGROUND

The present disclosure relates to a light emitting device, a method for fabricating the light emitting device, a light emitting device package, and a lighting system.

Group III-V nitride semiconductors are spotlighted as core materials of light emitting diodes (LEDs) or laser diodes (LDs) due to their physical and chemical characteristics. Such a group III-V semiconductor may be formed of a semiconductor material having a compositional formula of $In_xA-l_yGa_{1-x-y}N$ ($0 \leq x \leq 1$, $0 \leq y \leq 1$, $0 \leq x+y \leq 1$).

Light emitting diodes (LEDs) are a kind of semiconductor devices that convert electricity into infrared rays or light using characteristics of compound semiconductors to transmit/receive the converted infrared rays or light or utilize the converted infrared rays or light as light sources.

The LEDs or LDs using the semiconductor materials are widely used for light emitting devices for generating light. For example, the LEDs or LDs are used as light sources of various products such as light emitting parts of keypads of mobile terminals, electronic boards, and lighting devices.

SUMMARY

Embodiments provide a light emitting device having a new structure, a method for fabricating the light emitting device, a light emitting device package, and a lighting system.

Embodiments provide a light emitting device including a plurality of conductive layers and insulation support members under a light emitting structure layer, a method for fabricating the light emitting device, a light emitting device package, and a lighting system.

In one embodiment, a light emitting device includes: a light emitting structure layer including a first conductive type semiconductor layer, a second conductive type semiconductor layer, and an active layer between the first conductive type semiconductor layer and the second conductive type semiconductor layer; a first electrode electrically connected to the first conductive type semiconductor layer; an insulating support member under the light emitting structure layer; and a plurality of conductive layers between the light emitting structure layer and the insulating support member, wherein at least one of the plurality of conductive layers has a width greater than that of the light emitting structure layer and includes a contact part disposed further outward from a sidewall of the light emitting structure layer.

In another embodiment, a light emitting device includes: a light emitting structure layer including a first conductive type semiconductor layer, a second conductive type semiconductor layer, and an active layer between the first conductive type semiconductor layer and the second conductive type semiconductor layer; a first electrode electrically connected to the first conductive type semiconductor layer; an insulating support member under the light emitting structure layer; a plurality of conductive layers between the light emitting structure layer and the support member; and a protection member between the light emitting structure layer and the support member, wherein at least one of the plurality of conductive layers has a width greater than that of the light emitting structure layer and includes a first contact part corresponding to the first electrode.

In further another embodiment, a light emitting device package includes: a body; a plurality of lead electrodes including first and second lead electrodes on the body; a light emitting device on the second lead electrode, the light emitting device being electrically connected to the first and second lead electrodes; and a molding member covering the light emitting device, wherein the light emitting device includes: a light emitting structure layer including a first conductive type semiconductor layer, a second conductive type semiconductor layer, and an active layer between the first conductive type semiconductor layer and the second conductive type semiconductor layer; a first electrode electrically connected to the first conductive type semiconductor layer; an insulating support member under the light emitting structure layer; and a plurality of conductive layers between the light emitting structure layer and the insulating support member, wherein at least one of the plurality of conductive layers has a width greater than that of the light emitting structure layer and includes a contact part disposed further outward from a sidewall of the light emitting structure layer.

The details of one or more embodiments are set forth in the accompanying drawings and the description below. Other features will be apparent from the description and drawings, and from the claims.

DETAILED DESCRIPTION OF THE EMBODIMENTS

Figure 1:
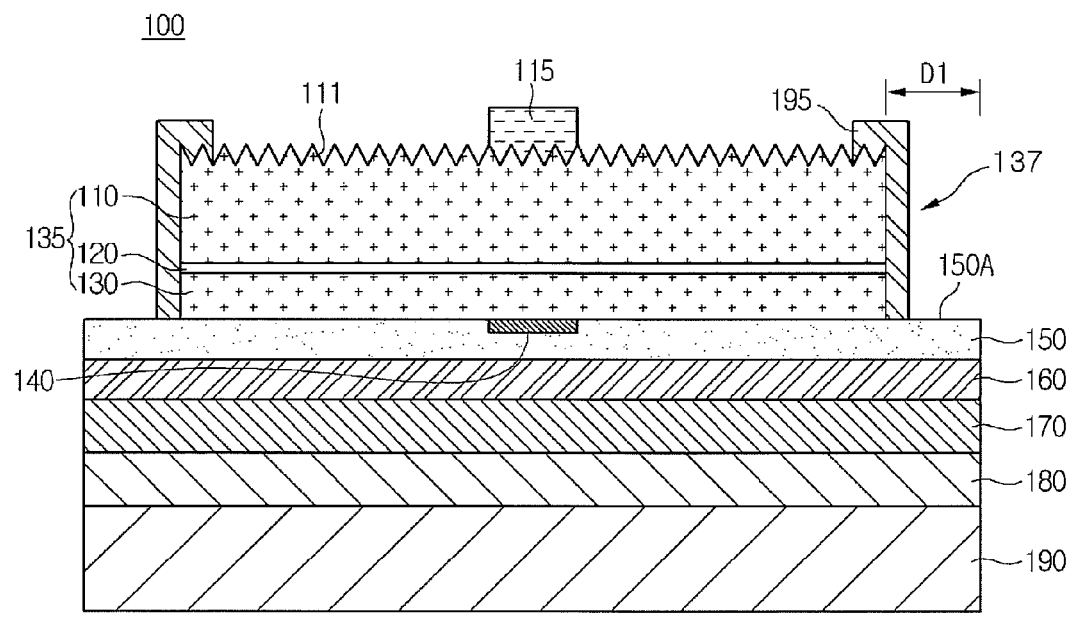
FIG. 1 is a side sectional view of a light emitting device according to a first embodiment.

In the description of embodiments, it will be understood that when a layer (or film), region, pattern or structure layer is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. In the drawings, the thickness or size of each layer is exaggerated, omitted, or schematically illustrated for convenience in description and clarity.

Hereinafter, a light emitting device, a light emitting device package, a lighting system according to embodiments will be described with reference to accompanying drawings.

FIG. 1 is a side sectional view of a light emitting device according to a first embodiment.

Referring to FIG. 1, a light emitting device 100 includes a first electrode 115, a light emitting structure layer 135, a current blocking layer (CBL) 140, a plurality of conductive layers 150, 160, 170, and 180, and a support member 190.

The light emitting structure layer 135 includes a first conductive type semiconductor layer 110 electrically connected to the first electrode 115, a second conductive type semiconductor layer 130, and an active layer 120 disposed between the first conductive type semiconductor layer 110 and the second conductive type semiconductor layer 130. The light emitting structure layer 135 may generate light by recombining electrons and holds supplied from the first and second conductive type semiconductor layers 110 and 130 with each other in the active layer 120.

The light emitting structure layer 135 may include a compound semiconductor layer including group III-V elements, e.g., the first conductive type semiconductor layer 110, the active layer 120 under the first conductive type semiconductor layer 110, and the second conductive type semiconductor layer 130 under the active layer 120.

The first conductive type semiconductor layer 110 may be formed of a group III-V compound semiconductor which is doped with a first conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 110 may be formed of one of GaN, AlGaN, InGaN, InAlGaN, AlInN, AlGaAs, GaP, GaAs, GaAsP, and AlGaInP. When the first conductive type semiconductor layer 110 is an N-type semiconductor layer, the first conductive type dopant may include N-type dopants such as Si, Ge, Sn, Se, and Te. The first conductive type semiconductor layer 110 may be formed as a single layer or a multi layer, but is not limited thereto. The first conductive type semiconductor layer 110 may include semiconductor layers having band gaps different from each other. The semiconductor layers having the band gaps different from each other may be alternately repeated in two or more pairs to form a super lattice structures.

The active layer 120 may be disposed under the first conductive type semiconductor layer 110. The active layer 120 may have one of a single quantum well structure, a multi quantum well (MQW) structure, a quantum dot structure, and a quantum wire structure. The active layer 120 may have a cycle of a well layer and a barrier layer, e.g., a cycle of an InGaN well layer/GaN barrier layer or an InGaN well layer/AlGaN barrier layer using the group III-V compound semiconductor material. The well layer may be formed of one of GaN, AlN, AlGaN, InGaN, InAlGaN, AlInN, AlGaAs, GaP, GaAs, GaAsP, and AlGaInP, and the barrier layer may be formed of at least one of GaN, AlN, AlGaN, InGaN, InN, InAlGaN, AlInN, AlGaAs, GaP, GaAs, GaAsP, and AlGaInP.

The barrier layer may be formed of a material having a band gap greater than that of the well layer.

The active layer 120 may emit one peak wavelength or a plurality of peak wavelengths within a range from a visible light band to an ultra violet band.

A clad layer (not shown) may be disposed on or/and under the active layer 120. The clad layer may be formed of a GaN-based semiconductor, but is not limited thereto. The clad layer disposed under the active layer 120 may include the conductive type dopant, and the clad layer disposed on the active layer 120 may include a second conductive type dopant.

The second conductive type semiconductor layer 130 may be disposed under the active layer 120. Also, the second conductive type semiconductor layer 130 may be formed of a group III-V compound semiconductor which is doped with the second conductive type dopant. The second conductive type semiconductor layer 130 may be formed of a semiconductor material having a compositional formula of $In_xAl_yGa_{1-x-y}N$ ($0 \leq x \leq 1$, $0 \leq y < 1$, $0 \leq x+y \leq 1$). For example, the second conductive type semiconductor layer 130 may be formed of one of GaN, AlN, AlGaN, InGaN, InN, InAlGaN, AlInN, AlGaAs, GaP, GaAs, GaAsP, and AlGaInP. When the second conductive type semiconductor layer 130 is a P-type semiconductor layer, the second conductive type dopant may include P-type dopants such as Mg and Zn. The second conductive type semiconductor layer 130 may include semiconductor layers having band gaps different from each other. The semiconductor layers having the band gaps different from each other may be alternately repeated in two or more pairs to form super lattice structures.

The light emitting structure layer 135 may further include a third semiconductor layer under the second conductive type semiconductor layer 130. Also, the first conductive type semiconductor layer 110 may be realized as the P-type semiconductor layer, and the second conductive type semiconductor layer 130 may be realized as the N-type semiconductor layer. Thus, the light emitting structure layer 135 may have at least one of an N-P junction structure, a P-N junction structure, an N-P-N junction structure, and a P-N-P junction structure.

The light emitting structure layer 135 may have inclined side surfaces through an isolation etching process for dividing a plurality of chips into individual unit chips. That is, the light emitting structure layer 135 may have a lower surface having an area greater than that of a top surface thereof.

A light extraction pattern 111 may be disposed on the top surface of the first conductive type semiconductor layer of the light emitting structure layer 135. The light extraction pattern 111 may minimize an amount of light totally reflected by a surface thereof to improve the light extraction efficiency of the light emitting device 100. The light extraction pattern 111 may have a random shape and arrangement or a specific shape and arrangement. For example, the light extraction pattern 111 may have a photonic crystal structure having a cycle of about 50 nm to about 3,000 nm. The photonic crystal structure may effectively extract light having a specific wavelength range to the outside due to an interference effect.

Also, the light extraction pattern 111 may have various shapes such as a cylindrical shape, a polygonal pillar shape, a cone shape, a polygonal cone shape, a truncated cone, and a polygonal truncated cone, but is not limited thereto. The light extraction pattern 111 may be omitted.

The first electrode 115 may be electrically connected to the first conductive type semiconductor layer 110 of the light emitting structure layer 135. The first electrode 115 may be disposed on a top surface or a portion of the first conductive type semiconductor layer 110. The first electrode 115 may be branched in a predetermined pattern shape. Also, the first electrode 115 may have a structure in which at least one pad and an electrode pattern having at least one shape and connected to the pad are equally or differently stacked with each other, but is not limited thereto. The first electrode 115 may be formed of a metal, e.g., at least one of Cr, Ni, Au, V, W, Ti, and Al. Also, the first electrode 115 may supply a power to the first conductive type semiconductor layer 110.

The plurality of conductive layers 150, 160, 170, and 180 may include at least three conductive layers. For example, the plurality of conductive layers 150, 160, 170, and 180 may include first to fourth conductive layers 150, 160, 170, and 180.

The first conductive layer 150 may be disposed between the light emitting structure layer 135 and the second conductive layer 160. The second conductive layer 160 may be disposed between the first conductive layer 150 and the third conductive layer 170. The third conductive layer 170 may be disposed between the second conductive layer 160 and the fourth conductive layer 180. The fourth conductive layer 180 may be disposed between the third conductive layer 170 and the support member 190.

The first conductive layer 150 makes ohmic contact with the second conductive type semiconductor layer 130 to smoothly supply a power to the second conductive type semiconductor layer 130. Also, a wire for supplying a power may be connected to the first conductive layer 150.

The first conductive layer 150 may contact the light emitting structure layer 135 except a portion on which the current blocking layer 140 is disposed. The first conductive layer 150 may selectively includes a light-transmitting conductive layer and a metal. For example, the first conductive layer 150 may be realized as a single or multi layer by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x/ITO$, Ni, Ag, Pt, In, Zn, and Sn.

The first conductive layer 150 may be further disposed under the current blocking layer 140, but is not limited thereto.

A distance D1 between a side surface of the first conductive layer 150 and a sidewall of the light emitting structure layer 135 may be greater than a thickness of an insulation layer 195. The first conductive layer 150 may have a width at least greater than that of the light emitting structure layer 135. A portion 150A of the first conductive layer 150 may protrude outward from the sidewall 137 of the light emitting structure layer 135 to define a bonding part. A top surface of the portion 150A of the first conductive layer 150 may be further exposed outward from the sidewall 137 of the light emitting structure layer 135 and a side surface of the insulation layer 195. Thus, a second electrode may be disposed on the top surface of the portion 150A of the first conductive layer 150, or the wire may be directly bonded to the top surface of the portion 150A of the first conductive layer 150. When the wire is directly bonded, a bonding material may be further disposed on the portion 150A of the first conductive layer 150, but is not limited thereto.

The current blocking layer 140 may be disposed between the first conductive layer 150 and the second conductive type semiconductor layer 130. At least one or more current blocking layers 140 may be disposed on a portion at which at least portion of the current blocking layer 140 vertically overlaps or does not vertically overlaps the first electrode 115. Thus, it may prevent a current from being concentrated into the shortest distance between the first electrode 115 and the support member 190 to improve the light emitting efficiency of the light emitting device 100. The current blocking layer 140 may be disposed corresponding to at least portion of the first electrode 115 in a thickness direction of the light emitting structure layer 135. The current blocking layer 140 may have an area greater than about 50% of that of the first electrode 115 or an area greater than that of the first electrode 115, but is not limited thereto.

The current blocking layer 140 may be formed of at least one of a material having insulating properties and a material schottky-contacting the second conductive type semiconductor layer 130. For example, the current blocking layer 140 may be formed of at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr. The current blocking layer 140 may be formed of a material different from that of the first conductive layer 150.

The current blocking layer 140 may be disposed between the second conductive layer 160 and the first conductive layer 150 or removed.

The second conductive layer 160 may include a reflective layer. Also, the second conductive layer 160 may be formed of a metallic material, and thus may have various reflective indexes according to characteristics of the metallic material. The reflective layer may reflect light incident from the light emitting structure layer 135 to improve the light emitting efficiency of the light emitting device 100. For example, the second conductive layer 160 may be formed of a metal or alloy including at least one of Ag, Ni, Al, Rh, Pd, Ir, Ru, Mg, Zn, Pt, Au, and Hf. Alternatively, the second conductive layer 160 may be formed as a multi layer using the metal or alloy and a light-transmitting conductive material such as ITO, IZO, IZTO, IAZO, IGZO, IGTO, AZO, or ATO. For example, the second conductive layer 160 may have a stacked structure such as IZO/Ni, AZO/Ag, IZO/Ag/Ni, AZO/Ag/Ni, Ag/Cu, or Ag/Pd/Cu.

The third conductive layer 170 may radiate heat generated in the light emitting structure layer 135 to prevent the light emitting device 100 from be deteriorated in reliability. Also, the third conductive layer 170 may have a thickness of about 0.1 μm to about 200 μm. The third conductive layer 170 may contact the light emitting structure layer 135 with a contact resistance greater than that of the first conductive layer 150. The third conductive layer 170 may be formed of at least one of Ni, Pt, Ti, W, V, Fe, and Mo. Also, the third conductive layer 170 may be formed as a single or multi layer. The third conductive layer 170 may be omitted.

The fourth conductive layer 180 may serve as a bonding layer and be disposed between the support member 190 and the third conductive layer 170 to enhance an adhesion therebetween. The fourth conductive layer 180 may include a barrier metal layer or a bonding metal layer. For example, the fourth conductive layer 180 may be formed of at least one of Ti, Au, Sn, Ni, Cr, Ga, Nb, In, Bi, Cu, Al, Si, Ag, and Ta. The fourth conductive layer 180 may be omitted.

The support member 190 may be formed of an insulating material and support the light emitting structure layer 135. The support member 190 may be formed of a material having insulating properties, e.g., at least one material of $SiO_2$, SiC, $SiO_x$, $SiO_xN_y$, $TiO_2$, and $Al_2O_3$. Also, the support member 190 may be formed of a material having a specific resistance of about $1\times10^{-4}$ Ω/cm or more. When the support member 190 is formed of the insulating material, a limitation in which the metal is melted by heat of a laser when the light emitting structure layer 135 is divided into chip units to generate burrs may be solved. A conductive support member is disposed under the support member 190 formed of the insulating material and is formed a metal material.

Alternatively, the support member 190 may be formed of a material having conductivity, e.g., at least one of copper (Cu), gold (Au), nickel (Ni), molybdenum (Mo), copper-tungsten (Cu—W), and carrier wafers such as Si, Ge, GaAs, GaN, ZnO, SiC, SiGe, etc. When the support member 190 is formed of the conductive material, thermal efficiency may be improved.

The support member 190 may be changed in thickness according to a design of the light emitting device 100. For example, the support member 190 may have a thickness of about 50 μm to 1,000 μm.

A bonding part may be disposed on on or/and under one of the plurality of conductive layers 150, 160, 170, and 180. The wire or the second electrode or/and a second pad may be directly formed on the bonding part. Thus, at least one of the plurality of conductive layers 150, 160, 170, and 180 may be used as a power supply path. For another example, the second electrode may be disposed on side surfaces of the plurality of conductive layers 150, 160, 170, and 180 or a side surface or the inside of the support member 190, but is not limited thereto.

Hereinafter, a method for fabricating the light emitting device according to the first embodiment will be described in detail. However, duplicate descriptions, which have been described already in the previous exemplary embodiment, will be omitted or described briefly. FIGS. 2 to 9 are views of a process for fabricating the light emitting device according to the first embodiment.

Figure 2:
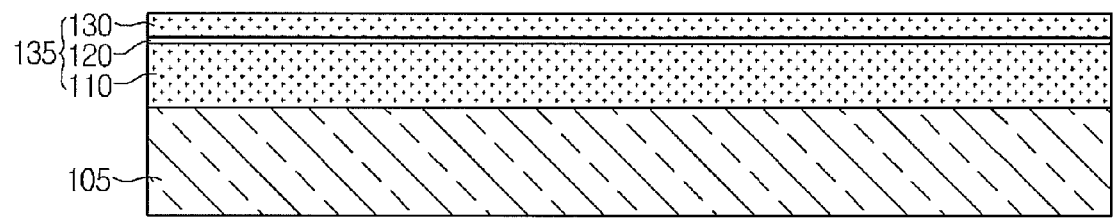
FIGS. 2 to 9 are views of a process for fabricating the light emitting device according to the first embodiment.

Referring to FIG. 2, a light emitting structure layer 135 may be formed on a growth substrate 105.

For example, the growth substrate 105 may be formed of at least one of sapphire ($Al_2O_3$), SiC, GaAs, GaN, ZnO, Si, GaP, InP, and Ge, but is not limited thereto. In the current embodiment, a silicon (Si) substrate is exemplified as the growth substrate. When the Si substrate is used as the growth substrate, a light emitting structure layer 135 including a first conductive type semiconductor layer, an active layer, and a second conductive type semiconductor layer is stacked on the growth substrate, and then a support member is coupled thereto. Since the Si growth substrate is separated by wet etching without performing a laser lift process, the growth substrate may be removed without applying a large impact. Thus, it may prevent cracks from occurring in the light emitting structure layer. Therefore, the light emitting device having improved reliability may be manufactured.

For example, the light emitting structure layer 135 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) may be formed between the first conductive type semiconductor layer 110 and the growth substrate 105 to reduce a lattice constant difference therebetween.

Figure 3:
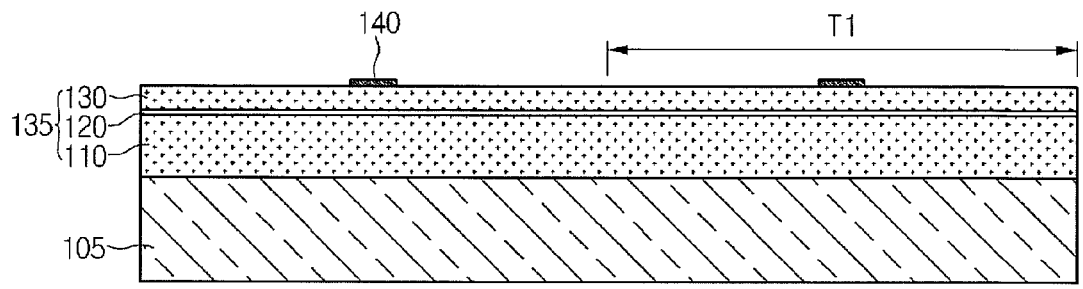

Referring to FIG. 3, a current blocking layer 140 may be formed on the second conductive type semiconductor layer 130. The current blocking layer 140 may be formed using a patterned mask. The current blocking layer 140 may be formed on a predetermination area within a first distance T1. The first distance T1 may be a width of at least one chip unit, but is not limited thereto.

At least one or more current blocking layers 140 may be formed on a portion at which at least portion of the current blocking layer 140 vertically overlaps or does not vertically overlaps a first electrode 115. Thus, it may prevent a current from being concentrated into a specific area within the light emitting structure layer 135.

Figure 4:
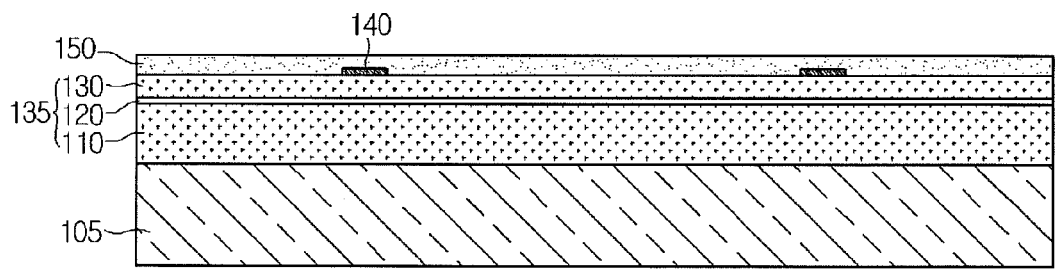
Figure 5:
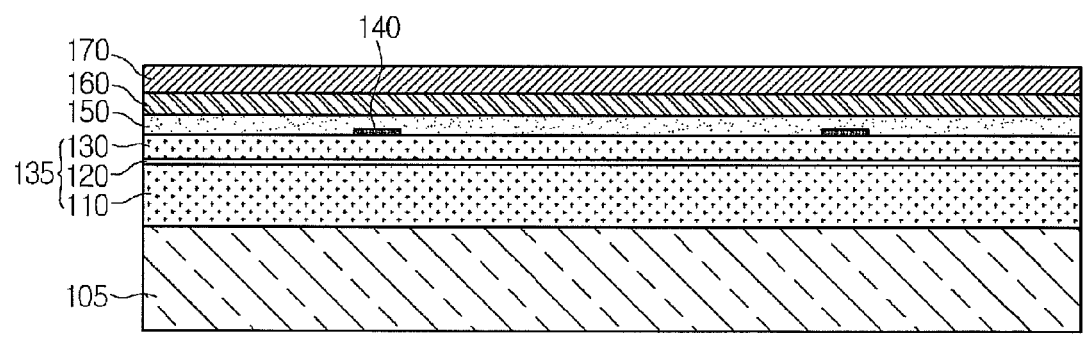

Referring to FIGS. 4 and 5, a first conductive layer 150 may be formed on the second conductive type semiconductor layer 130 and the current blocking layer 140. A second conductive layer 160 and a third conductive layer 170 may be formed on the first conductive layer 150. The first conductive layer 150 may cover the second conductive type semiconductor layer 130 and the current blocking layer 140.

For example, the first, second, and third conductive layers 150, 160, and 170 may be formed using one of an E-beam deposition process, a sputtering process, and a plasma enhanced chemical vapor deposition (PECVD) process.

Figure 6:
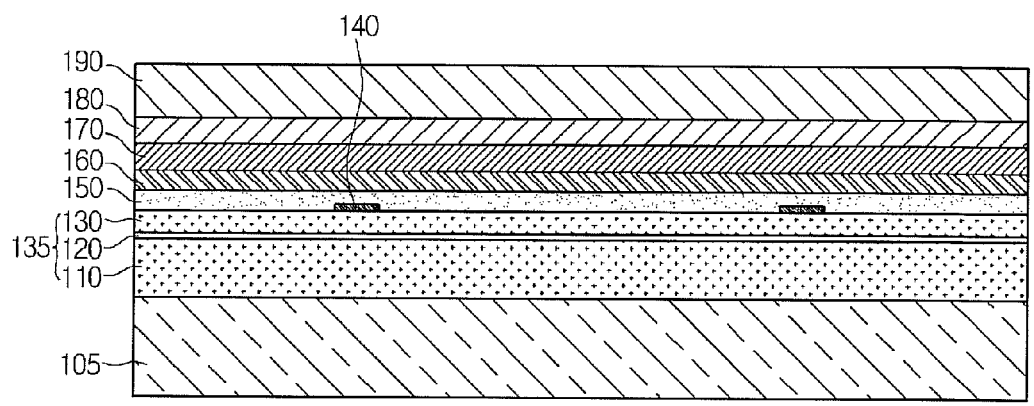

Referring to FIG. 6, a fourth conductive layer 180 and a support member 190 may be formed on the third conductive layer 170. The fourth conductive layer 180 may be formed between the third conductive layer 170 and the support member 190 to enhance an adhesion therebetween.

The support member 190 may be prepared as a separate sheet. The support member 190 may adhere to the fourth conductive layer 180 through a bonding process or be deposited on the fourth conductive layer 180 through a deposition process, but is not limited thereto.

Figure 7:
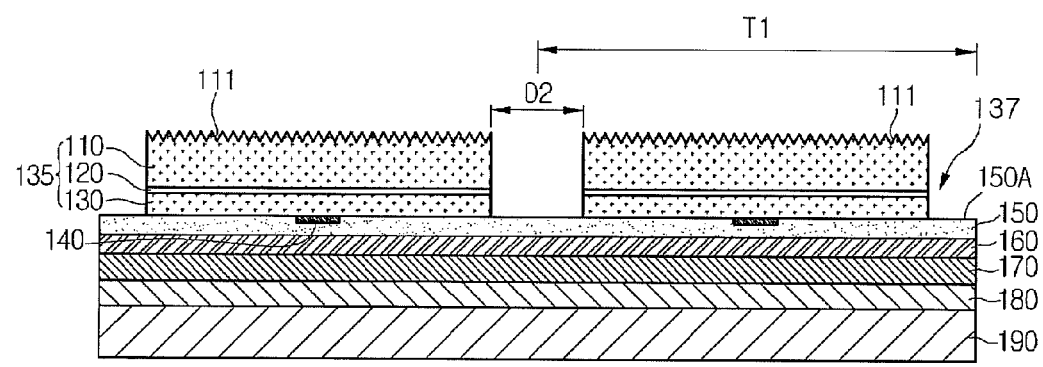

Referring to FIG. 7, the growth substrate 105 may be removed from the light emitting device of FIG. 6.

The growth substrate 105 may be removed by an etching process. As the growth substrate 105 is removed, a surface of the first conductive type semiconductor layer 110 may be exposed.

Then, an etching process may be performed on the light emitting structure layer 135 along a boundary of the first distance T1 to divide the light emitting structure layer 135 into a plurality of light emitting structure layers 135. A distance D2 between the light emitting structure layers 135 may be twice the distance D1 of FIG. 1, but is not limited thereto.

Sidewalls 137 of the light emitting structure layers 135 may be exposed. The etching process may be defined as an isolation etching process. For example, the etching process may be realized through a dry etching process such as an inductively coupled plasma process or a wet etching process using an etchant such as KOH, $H_2SO_4$, or $H_3PO_4$, but is not limited thereto.

Although the light emitting structure layer 135 has a vertical side surface in the current embodiment, the light emitting structure layer 135 may have an inclined side surface by the isolation etching process.

A light extraction pattern 111 may be formed on a top surface of the first conductive type semiconductor layer 110. The light extraction pattern 111 may have a random shape and arrangement or a specific shape and arrangement.

Figure 8:
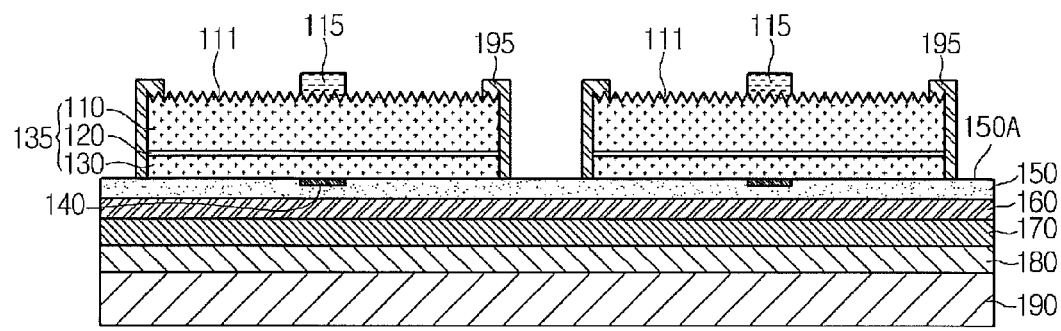

Referring to FIG. 8, the first electrode 115 may be formed on a portion of the top surface of the first conductive type semiconductor layer 110. The first electrode 115 may be formed of a metal, e.g., at least one of Cr, Ni, Au, Ti, and Al.

The first electrode 115 may be formed using one of an E-beam deposition process, a physical vapor deposition (PVD) process, a chemical vapor deposition (CVD) process, a plasma laser deposition (PLD) process, a dual-type thermal evaporator process, and a sputtering process.

Next, an insulation layer 195 may be formed on the side surface of the light emitting structure layer 135 and a top surface of the first conductive type semiconductor layer 110. Although the insulation layer 195 is formed on a portion of the top surface of the first conductive type semiconductor layer in the current embodiment, the insulation layer 195 may be formed on an area except the area on which the first electrode 115 is formed. The insulation layer 195 may be formed of an insulating and light-transmitting material, e.g., one of $SiO_2$, $SiO_x$, $SiO_xN_y$, $Si_3N_4$, and $Al_2O_3$.

The insulation layer 195 may be formed using the E-beam deposition process, the sputtering process, or the plasma enhanced chemical vapor deposition (PECVD) process.

The light extraction pattern 111 and the insulation layer 195 may vertically and at least partially overlap each other. Also, the light extraction pattern 111 and the insulation layer 195 may be formed on the area except the area on which the first electrode 115 is formed on the first conductive type semiconductor layer 110. Thus, it may prevent the insulation layer 195 and the first conductive type semiconductor layer 110 from being easily separated from each other to improve reliability of the light emitting device 100.

Figure 9:
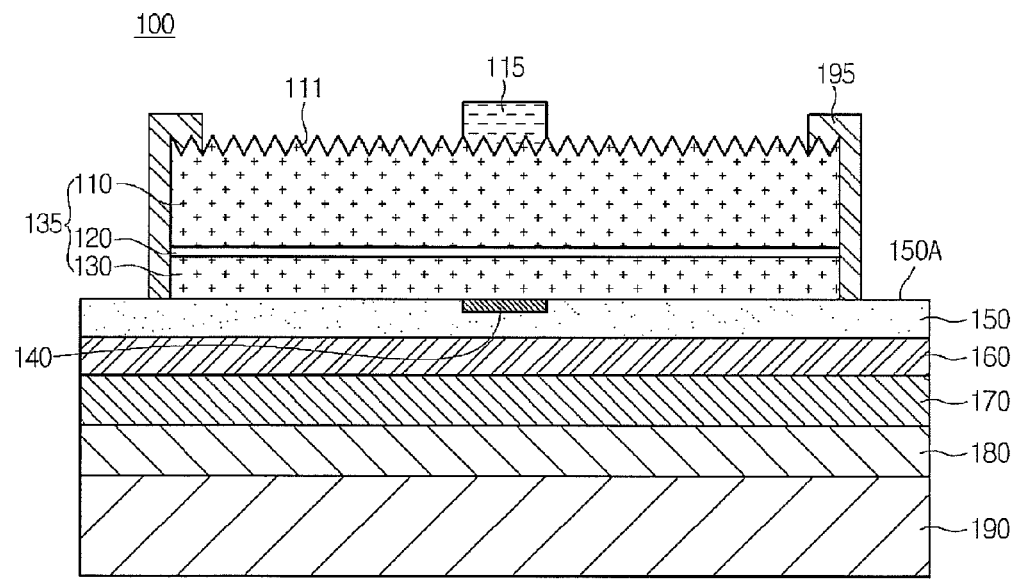

Referring to FIG. 9, a chip separation process for dividing the light emitting device of FIG. 8 into device units may be performed to provide the light emitting device 100 according to the current embodiment.

For example, the chip separation process may be performed by selectively using a breaking process in which a physical force is applied using a blade to separate a chip, a laser scribing process in which a chip boundary is irradiated with a laser to separate a chip, and an etching process including a wet or dry etching process, but is not limited thereto.

According to the current embodiment, when the growth substrate is formed of silicon, the light emitting structure layer 135 including the first conductive type semiconductor layer 110, an active layer 120, and the second conductive type semiconductor layer 130 may be stacked on the growth substrate, and then the support member 190 may be coupled thereto. The silicon growth substrate 105 may be separated through the wet etching process without performing the laser scribing process. Thus, the growth substrate may be removed without applying a large impact to prevent cracks from occurring in the light emitting structure layer 135. Therefore, the reliability of the light emitting device may be improved.

Also, the chip separation process for dividing the light emitting device into individual device units may be realized through the laser scribing process. In this case, when the support member 190 is formed of a conductive material such as a metal, the support member may be melted by heat of a laser to generate burrs, thereby deteriorating the reliability of the device. However, when the support member 190 is formed of an insulating material, the above-described limitation may be solved.

Figure 10:
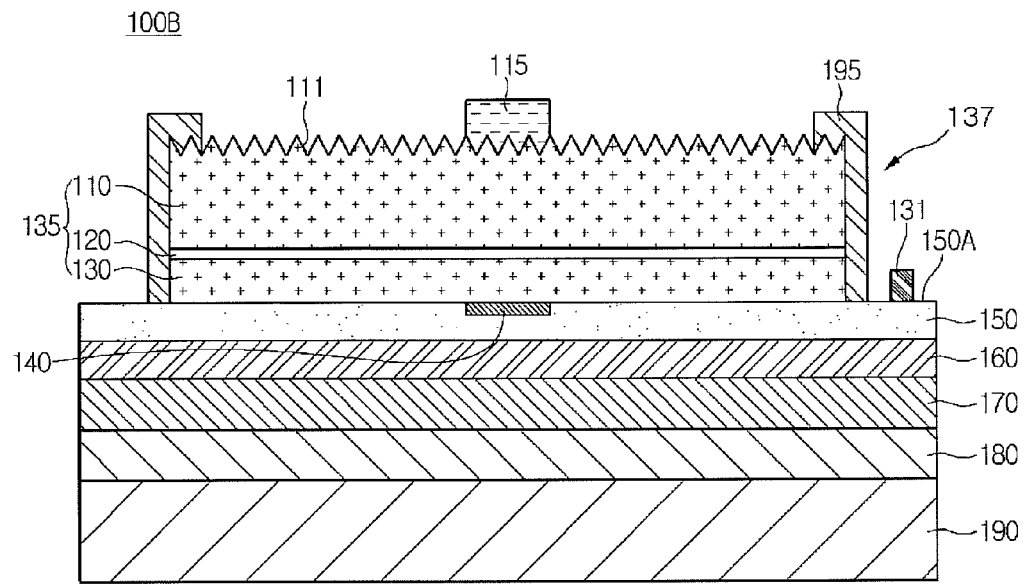
FIG. 10 is a side sectional view of a light emitting device according to a second embodiment.

FIG. 10 is a side sectional view of a light emitting device according to a second embodiment.

Referring to FIG. 10, a light emitting device 100B may include a first electrode 115, a second electrode 131, a light emitting structure layer 135, a current blocking layer 140, a plurality of conductive layers 150, 160, 170, and 180, and a support member 190.

The second electrode 131 may be formed on a portion 150A of an top surface area of the first conductive layer 150 exposed by an isolation etching process for dividing the light emitting structure layer 135 into a plurality of light emitting structure layers 135. For another example, the second electrode 131 may be disposed on at least one of the second to fourth conductive layers 160, 170, and 180.

The second electrode 131 may be formed of a metal, e.g., at least one of Cr, Ni, Au, V, W, Ti, and Al. Also, the second electrode 131 may supply a power to the second conductive type semiconductor layer 130.

The second electrode 131 may be electrically connected to the second conductive type semiconductor layer 130 through the third conductive layer 170 to supply a power to the second conductive type semiconductor layer 130. The second electrode 131 may be connected to a wire.

The second electrode 131 may be spaced from a sidewall 137 of the light emitting structure layer 135. Also, the second electrode 131 may directly contact the portion 150A of the first conductive layer 150. The power supplied into the second electrode 131 may be supplied into the second conductive type semiconductor layer 130 through the first conductive layer 150.

The second electrode 131 may be spaced from at least one side surface of side surfaces of the light emitting structure layer 135 or spaced from the plurality of side surfaces. The second electrode 131 may include an electrode pattern.

Figure 11:
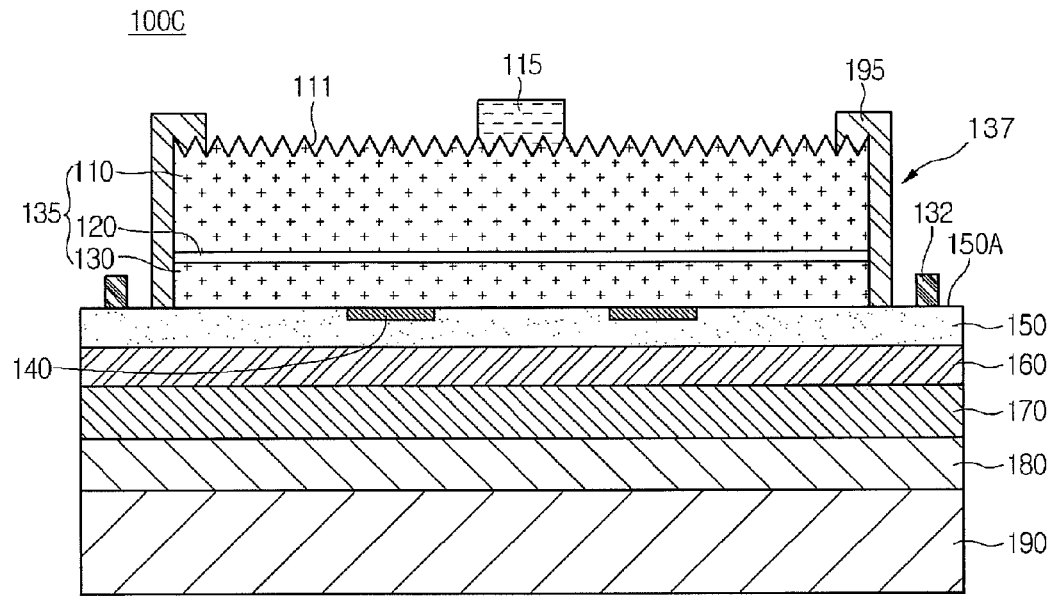
FIG. 11 is a side sectional view of a light emitting device according to a third embodiment.

FIG. 11 is a sectional view of a light emitting device according to a third embodiment.

Referring to FIG. 11, a light emitting device 100C may include a first electrode 115, a second electrode 131, a light emitting structure layer 135, current blocking layers 140 spaced from each other, a plurality of conductive layers 150, 160, 170, and 180, and a support member 190.

The current blocking layers 140 may be spaced from each other on an area on which the current blocking layers 140 do not vertically overlap the first electrode 115. Alternatively, the current blocking layers 140 may have holes in an area corresponding to that of the first electrode 115.

The second electrode 131 may be disposed on a portion 150A of the first conductive layer 150. Also, the second electrode 131 may disposed corresponding to at least one sidewall 137 of the light emitting structure layer 135. The second electrode 131 may have a long line shape having a length greater than a width of the light emitting structure layer 135. Also, the second electrode 131 may be disposed corresponding to the plurality of sidewalls 137 of the light emitting structure layer 135.

The second electrode 131 may contact or be spaced from an insulation layer 195 disposed on a side surface of the light emitting structure layer 135, but is not limited thereto.

The current blocking layers 140 may be disposed on areas different from each other to more effectively prevent a current supplied into the second conductive type semiconductor layer 130 from being concentrated. The current blocking layer 140 may be provided in plurality or may have a ring shape with a hole therein.

Figure 12:
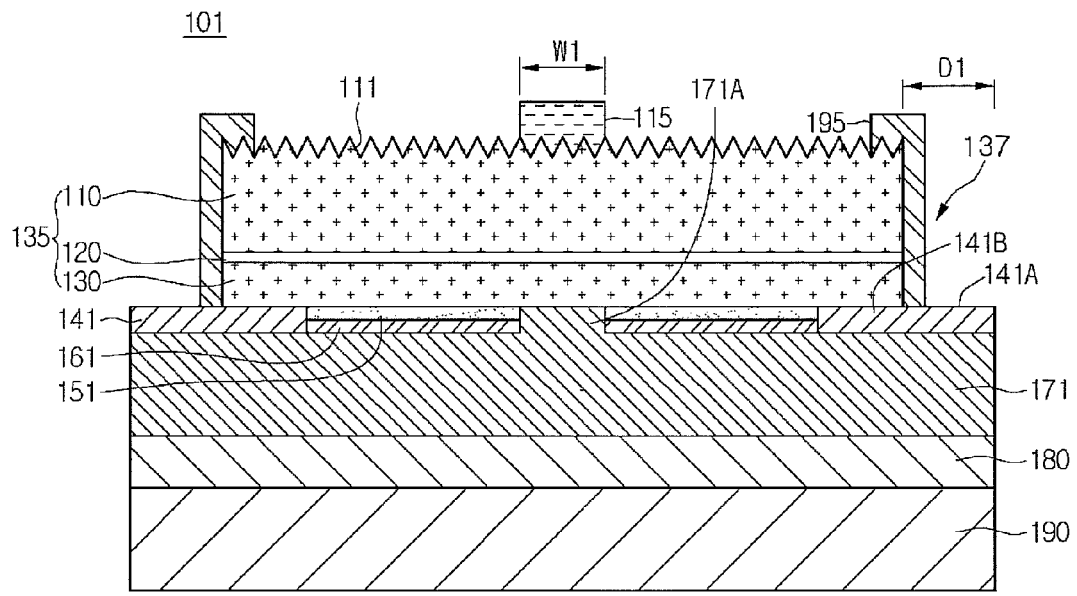
FIG. 12 is a sectional view of a light emitting device according to a fourth embodiment.

FIG. 12 is a side sectional view of a light emitting device according to a fourth embodiment.

Referring to FIG. 12, a light emitting device 101 may include a first electrode 115, a light emitting structure layer 135, a protection member 141, a plurality of conductive layers 151, 161, 171, and 180, and a support member 190.

The protection member 141 may be disposed between the support member 190 and the second conductive type semiconductor layer 130. The plurality of conductive layers 151, 161, 171, and 180 may be disposed between the support member 190 and the second conductive type semiconductor layer 130.

The light emitting structure layer 135 may include a first conductive type semiconductor layer 110, an active layer 120, and a second conductive type semiconductor layer 130. Here, electrons and holes supplied from the first and second conductive type semiconductor layer 110 and 130 may be recombined with each other in the active layer 120 to generate light.

The support member 190 may include an insulating support member or a conductive support member and support the light emitting structure layer 135. The support member 190 may be formed of a material having insulating properties, e.g., at least one material of $SiO_2$, SiC, $SiO_x$, $SiO_xN_y$, $TiO_2$, and $Al_2O_3$. Also, the support member 190 may be formed of a material having a specific resistance of about $1\times10^{-4}$ Ω/cm or more.

For another example, the support member 190 may be formed of a material having conductivity, e.g., at least one of copper (Cu), gold (Au), nickel (Ni), molybdenum (Mo), copper-tungsten (Cu—W), and carrier wafers such as Si, Ge, GaAs, GaN, ZnO, Sic, SiGe, etc.

The support member 190 may be changed in thickness according to a design of the light emitting device. For example, the support member 190 may have a thickness of about 50 μm to 1,000 μm.

The fourth conductive layer 180 may be disposed on the support member 190. The fourth conductive layer 180 may serve as a bonding layer and be disposed between the support member 190 and the third conductive layer 171 to enhance an adhesion therebetween. The fourth conductive layer 180 may include a barrier metal layer or a bonding metal layer. For example, the fourth conductive layer 180 may be formed of at least one of Ti, Au, Sn, Ni, Cr, Ga, Nb, In, Bi, Cu, Al, Si, Ag, and Ta.

The third conductive layer 171 may be disposed on the fourth conductive layer 180. A first contact part 172 of the third conductive layer 171 may contact the second conductive type semiconductor layer 130. Also, the first contact part 172 may serve as an electrode or bonding pad of the second conductive type semiconductor layer 130 to supply a power into the second conductive type semiconductor layer 130. The fourth conductive layer 180 may be omitted.

The first contact part 172 of the third conductive layer 171 may vertically overlap the first electrode 115. Also, the first contact part 172 may physically or/and electrically contact the lowermost layer of the light emitting structure layer 135, e.g., a lower surface of the second conductive type semiconductor layer 130 through the first and second conductive layers 151 and 161. The first contact part 172 of the third conductive layer 171 may have the same width as that W1 of the first electrode 115 or a width different from that W1 of the first electrode 115. The first contact part 172 of the third conductive layer 171 may serve as a current blocking part and makes schottky contact with the second conductive type semiconductor layer 130. The first contact part 172 of the third conductive layer 171 may further protrude from a top surface of the third conductive layer 171, but is not limited thereto.

The third conductive layer 171 may be formed of at least one of Ni, Pt, Ti, W, V, Fe, and Mo. Also, the third conductive layer 171 may be formed as a single or multi layer.

The third conductive layer 171 may radiate heat generated in the light emitting structure layer 135 to prevent the light emitting device from be deteriorated in reliability. Also, the third conductive layer 171 may have a thickness of about 0.1 μm to about 200 μm. The third conductive layer 171 may serve as a heat radiating plate for releasing heat and an electrode for supplying a power under the light emitting structure layer 135. The third conductive layer 171 may contact the light emitting structure layer 135 with a contact resistance greater than that of the first conductive layer 151.

The second conductive layer 161 may be disposed on the third conductive layer 171. The second conductive layer 161 may include a reflective layer. Also, the second conductive layer 161 may be formed a metallic material having a reflective index of about 50% or more, and thus may have various reflective indexes according to characteristics of the metallic material. Thus, the reflective layer may reflect light incident from the light emitting structure layer 135 to improve light emitting efficiency of the light emitting device.

For example, the second conductive layer 161 may be formed of a metal or alloy including at least one of Ag, Ni, Al, Rh, Pd, Ir, Ru, Mg, Zn, Pt, Au, and Hf. Alternatively, the second conductive layer 160 may be formed as a multi layer using the metal or alloy and a light-transmitting conductive material such as ITO, IZO, IZTO, IAZO, IGZO, IGTO, AZO, or ATO. For example, the second conductive layer 160 may have a stacked structure such as IZO/Ni, AZO/Ag, IZO/Ag/Ni, AZO/Ag/Ni, Ag/Cu, or Ag/Pd/Cu.

The first conductive layer 151 may be disposed on the second conductive layer 161. The first conductive layer 151 makes ohmic contact with a lower surface of the second conductive type semiconductor layer 130 to smoothly supply a power to the light emitting structure layer 135.

The first conductive layer 151 may be formed of at least one of a light-transmitting conductive layer and a metal. For example, the first conductive layer 151 may be realized as a single or multi layer by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Pt, In, Zn, and Sn.

Each of the first conductive layer 151 and the second conductive layer 161 has a hole therein. The first contact part 172 of the third conductive layer 171 may be disposed in the hole.

Each of the first conductive layer 151 and the second conductive layer 161 may have a width less than that of the third conductive layer 171. The first conductive layer 151 and the second conductive layer 161 may have the same width as each other. Alternatively, the second conductive layer 161 may have a width greater than that of the first conductive layer 151. At least one of the first conductive layer 151 and the second conductive layer 161 may be further disposed on a lower surface of the protection member 141.

The protection member 141 may be disposed on a periphery area of a top surface of the third conductive layer 171. An inner part 141B of the protection member 141 may be disposed between the third conductive layer 171 and the light emitting structure layer 135 to contact the lower surface of the second conductive type semiconductor layer 130. An outer part 141A of the protection member 141 may further protrude outward from a sidewall 137 of the light emitting structure layer 135. A distance D1 between an outer surface of the protection member 141 and the sidewall 137 of the light emitting structure layer 135 may greater than a thickness of an insulation layer 195. Thus, the outer part 141A of the protection member 141 may have a structure stepped from the sidewall 137 of the light emitting structure layer 135.

The protection member 141 may contact a periphery of the lower surface of the light emitting structure layer 136. When viewed from the top side, the protection member 141 may have a ring shape, a loop shape, or a frame shape. The protection member 141 may have a continuous or discontinuous shape, but is not limited thereto. The first conductive layer 141 and the second conductive layer 151 may be disposed in the hole defined in the inner part 141B of the protection member 141.

When an isolation etching process is performed during the process for fabricating the light emitting device, the light emitting structure layer 135 may be etched using a material such as $Cl_2$ or $BCl_2$. Here, a portion of the third conductive layer 171 formed of a metallic material may be melted during the etching. As a result, when the melted metal contacts the active layer 120, the third conductive layer 171 and the active layer 120 may be electrically short-circuited. Thus, the protection member 141 may be disposed on the periphery of the lower surface of the light emitting structure layer 135 to improve the reliability of the light emitting device. The protection member 141 may be disposed on at least one portion of a lower portion of the third conductive layer 171 exposed by etching the light emitting structure layer 135.

The protection member 141 may be formed of a material having insulating properties or a material having conductivity less than that of the second conductive layer 161 or the third conductive layer 171. For example, the protection member 141 may be formed of at least one of ITO, IZO, IZTO, IAZO, IGZO, IGTO, AZO, ATO, ZnO, $SiO_2$, $SiO_2$, $SiO_xN_y$, $Si_3N_4$, $Al_2O_3$, TiOx, and TiO2. A hole or opened area may be defined in the outer part 141A of the protection member 141. A power supply member such as a wire or pad may be disposed in the hole or opened area and thus electrically connected to the second conductive layer 171.

The light emitting structure layer 135 may be disposed on the first conductive layer 151 and the protection member 141.

The light emitting structure layer 135 may include a compound semiconductor layer including group III-V elements, e.g., the first conductive type semiconductor layer 110, the active layer 120 under the first conductive type semiconductor layer 110, and the second conductive type semiconductor layer 130 under the active layer 120.

The first conductive type semiconductor layer 110 may be formed of a group III-V compound semiconductor which doped with a first conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 110 may be formed of one of GaN, AlN, AlGaN, InGaN, InN, InAlGaN, AlInN, AlGaAs, GaP, GaAs, GaAsP, and AlGaInP. When the first conductive type semiconductor layer 110 is an N-type semiconductor layer, the first conductive type dopant may include N-type dopants such as Si, Ge, Sn, Se, and Te. The first conductive type semiconductor layer 110 may be formed as a single layer or a multi layer, but is not limited thereto.

The active layer 120 may be disposed under the first conductive type semiconductor layer 110. The active layer 120 may have one of a single quantum well structure, a multi quantum well (MQW) structure, a quantum dot structure, and a quantum wire structure. The active layer 120 may have a cycle of a well layer and a barrier layer, e.g., a cycle of an InGaN well layer/GaN barrier layer or an InGaN well layer/AlGaN barrier layer using the group III-V compound semiconductor material.

A conductive type clad layer (not shown) may be formed above or/and under the active layer 120. The conductive type clad layer may be formed of an AlGaN-based semiconductor.

The second conductive type semiconductor layer 130 may be disposed under the active layer 120. Also, the second conductive type semiconductor layer 130 may be formed of a group III-V compound semiconductor which is doped with a second conductive type dopant. The second conductive type semiconductor layer 130 may be formed of a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 130 may be formed of one of GaN, AlN, AlGaN, InGaN, InN, InAlGaN, AlInN, AlGaAs, GaP, GaAs, GaAsP, and AlGaInP. When the second conductive type semiconductor layer 130 is a P-type semiconductor layer, the second conductive type dopant may include P-type dopants such as Mg and Zn.

The light emitting structure layer 135 may include a semiconductor layer of first conductive under the second conductive type semiconductor layer 130. Also, the first conductive type semiconductor layer 110 may be realized as the P-type semiconductor layer, and the second conductive type semiconductor layer 130 may be realizes as the N-type semiconductor layer. Thus, the light emitting structure layer 135 may have at least one of an N-P junction structure, a P-N junction structure, an N-P-N junction structure, and a P-N-P junction structure.

The light emitting structure layer 135 may have inclined side surfaces through an isolation etching process for dividing a plurality of chips into individual unit chips.

Also, a light extraction pattern 111 may be disposed on the top surface of the light emitting structure layer 135. The light extraction pattern 111 may minimize an amount of light totally reflected by a surface thereof to improve the light extraction efficiency of the light emitting device.

The light extraction pattern 111 may have a random shape and arrangement or a specific shape and arrangement. For example, the light extraction pattern 111 may have a photonic crystal structure having a cycle of about 50 nm to about 3,000 nm. The photonic crystal structure may effectively extract light having a specific wavelength range to the outside due to an interference effect. Also, the light extraction pattern 111 may have various shapes such as a cylindrical shape, a polygonal pillar shape, a cone shape, a polygonal cone shape, a truncated cone, and a polygonal truncated cone, but is not limited thereto.

The first electrode 115 may be disposed on a top surface of the light emitting structure layer 135. The first electrode 115 may be branched in a predetermined pattern shape, but is not limited thereto. Also, the first electrode 115 may have a structure in which at least one pad and an electrode pattern having at least one shape and connected to the pad are equally or differently stacked with each other, but is not limited thereto. The first electrode 115 may be formed of a metal, e.g., at least one of Cr, Ni, Au, V, W, Ti, and Al. Also, the first electrode 115 may supply a power to the first conductive type semiconductor layer 110.

Hereinafter, a method for fabricating the light emitting device according to the fourth embodiment will be described in detail. However, duplicate descriptions, which have been described already in the previous exemplary embodiment, will be omitted or described briefly.

FIGS. 13 to 21 are views of a process for fabricating a light emitting device according to the first embodiment.

Figure 13:
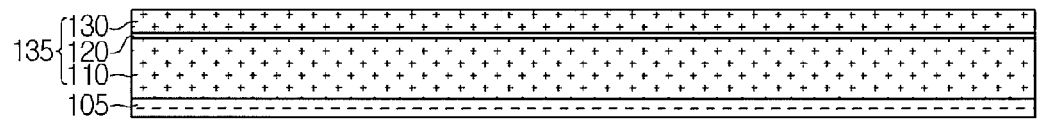
FIGS. 13 to 21 are views of a process for fabricating the light emitting device according to the fourth embodiment.

Referring to FIG. 13, a light emitting structure layer 135 may be formed on a growth substrate 105.

For example, the growth substrate 105 may be formed of at least one of sapphire ($Al_2O_3$), SiC, GaAs, GaN, ZnO, Si, GaP, InP, and Ge, but is not limited thereto. In the current embodiment, a silicon (Si) substrate is exemplified as the growth substrate. When the Si substrate is used as the growth substrate, a light emitting structure layer 135 including a first conductive type semiconductor layer 110, an active layer 120, and a second conductive type semiconductor layer 130 is stacked on the growth substrate 105, and then a support member is coupled thereto. Since the Si growth substrate is separated by wet etching without performing a laser lift process, the growth substrate may be removed without applying a large impact. Thus, it may prevent cracks from occurring in the light emitting structure layer 135. Therefore, the light emitting device having improved reliability may be manufactured, and also, the light emitting device may be inexpensive to improve productivity.

For example, the light emitting structure layer 135 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) may be formed between the first conductive type semiconductor layer 110 and the growth substrate 105 to reduce a lattice constant difference therebetween.

Figure 14:
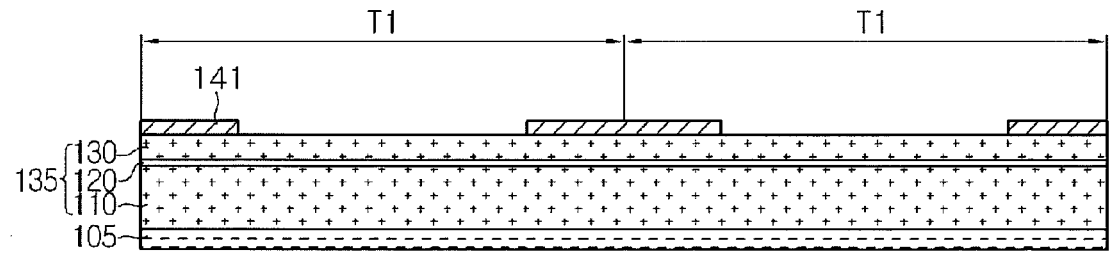

Referring to FIG. 14, a protection member 141 may be formed on a boundary of a first distance T1 on the light emitting structure layer 135. The protection member 141 may be formed around a boundary of an individual chip distance using a patterned mask. The protection member 141 may have a ring shape, a loop shape, or a frame shape which has a hole therein when viewed from the top side. For example, the protection member 141 may be formed using an E-beam deposition process, a sputtering process, or a plasma enhanced chemical vapor deposition (PECVD) process.

Figure 15:
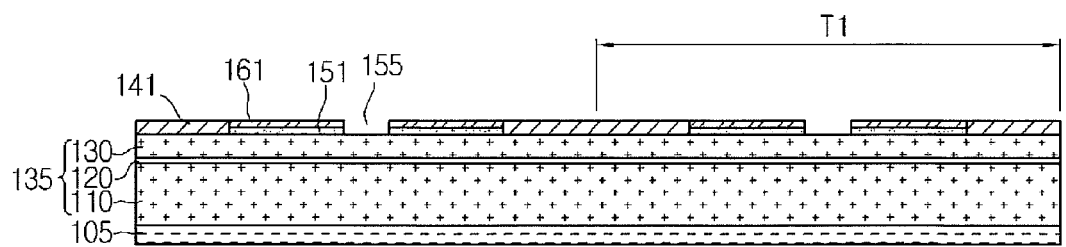

Referring to FIG. 15, a first conductive layer 151 may be formed on the second conductive type semiconductor layer 130, and a second conductive layer 161 may be formed on the first conductive layer 151. The first and second conductive layers 151 and 161 may be formed on a portion of the second conductive type semiconductor layer 130. A hole 155 may be defined in the first and second conductive layers 151 and 161.

For example, the first and second conductive layers 151 and 161 may be formed using one of an E-beam deposition process, a sputtering process, and a plasma enhanced chemical vapor deposition (PECVD) process.

Figure 16:
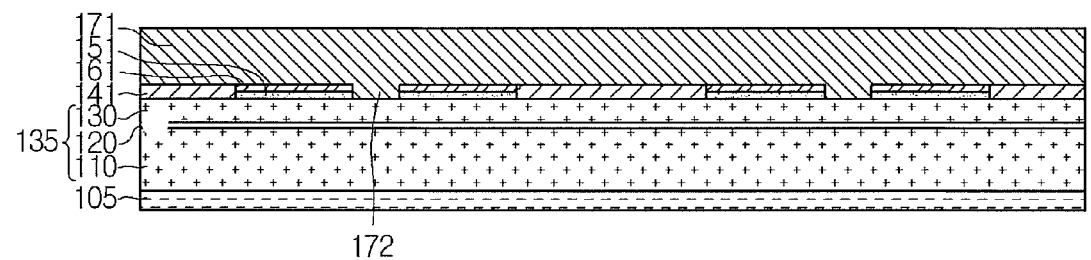

Referring to FIGS. 15 and 16, a third conductive layer 171 may be formed on the second conductive type semiconductor layer 130, a protection member 141, and a second conductive layer 161. The third conductive layer 171 may cover the protection member 141 and the first and second conductive layers 151 and 161. Also, the third conductive layer 171 may contact the second conductive type semiconductor layer 130 on an area on which the protection member 141 and the first and second conductive layers 151 and 161 are not formed. A first contact part 172 of the third conductive layer 171 may contact the second conductive type semiconductor layer 130 through the hole 155.

Figure 17:
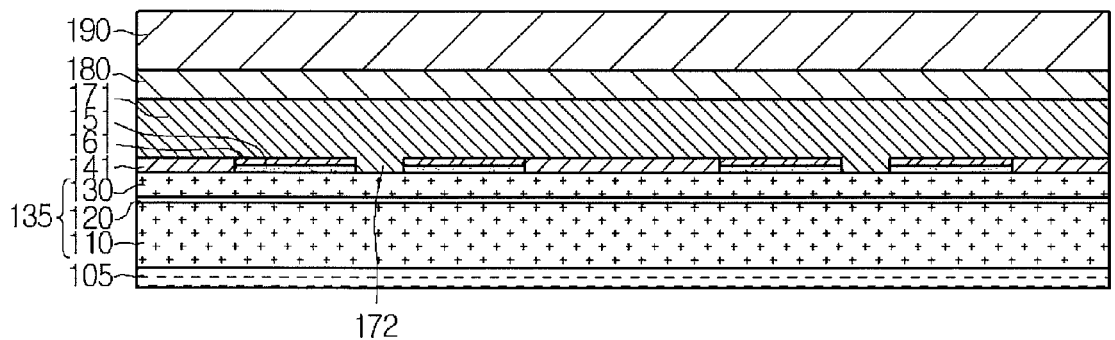

Referring to FIG. 17, a fourth conductive layer 180 may be formed on the third conductive layer 171, and a support member 190 may be formed on the fourth conductive layer 180.

The fourth conductive layer 180 may be formed between the third conductive layer 171 and the support member 190 to enhance an adhesion therebetween.

The support member 190 may be prepared as a separate sheet. The support member 190 may adhere to the fourth conductive layer 180 through a bonding process or be deposited on the fourth conductive layer 180 through a deposition process, but is not limited thereto.

Figure 18:
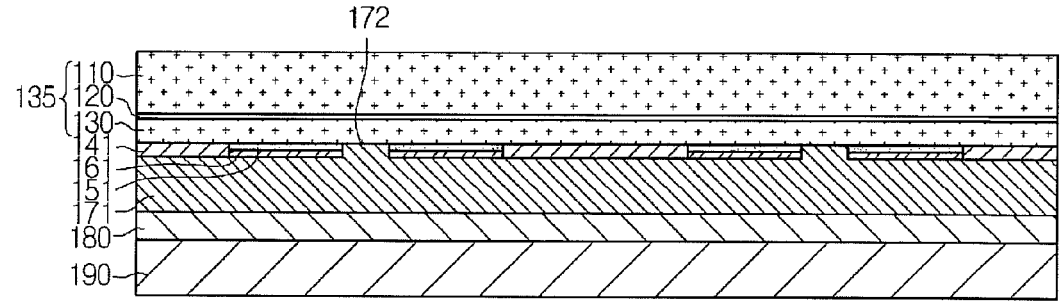

Referring to FIG. 18, the growth substrate 105 may be removed from the light emitting device of FIG. 17. The growth substrate 105 may be removed by an etching process. The growth substrate 105 may be removed to expose a top surface of the first conductive type semiconductor layer 110.

Figure 19:
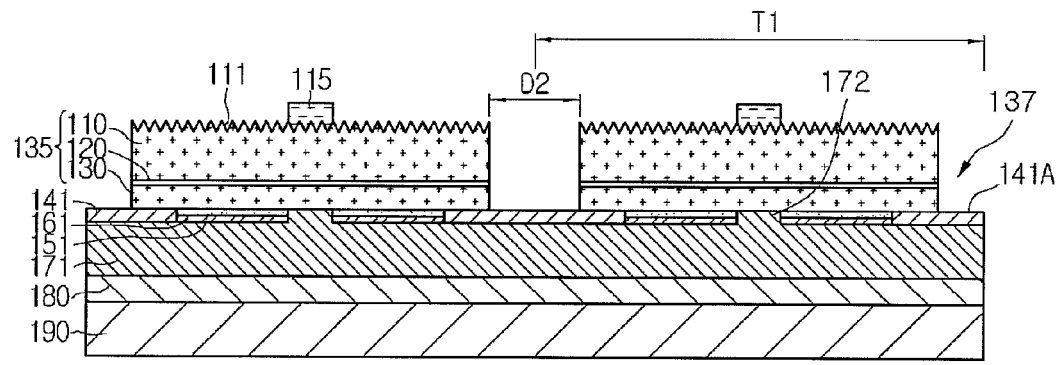

Referring to FIG. 19, an isolation etching process may be performed on the light emitting structure layer 135 along a boundary (i.e., a chip boundary) of a first distance T to divide the light emitting structure layer 135 into a plurality of light emitting structure layers 135. Sidewalls 137 of the light emitting structure layers adjacent to each other are spaced from each other. For example, the isolation etching process may be performed through a dry etching process such as an inductively coupled plasma (ICP) process or a wet etching using an etchant such as KOH, $H_2SO_4$, $H_3PO_4$, but is not limited thereto.

Although the light emitting structure layer 135 has a vertical side surface in the current embodiment, the light emitting structure layer 135 may have an inclined side surface by the isolation etching process. Also, a portion of a top surface of the third conductive layer 171 may be exposed by the isolation etching process.

A light extraction pattern 111 may be formed on a top surface of the first conductive type semiconductor layer 110. The light extraction pattern 111 may have a random shape and arrangement or a specific shape and arrangement. A wet etching process may be performed on the top surface of the light emitting structure layer 135 or a physical process such as a polishing process may be performed to form the light extraction pattern 111 having the random shape.

A pattern mask including a desired pattern having a shape corresponding to that of the light extraction pattern 111 may be formed on the top surface of the first conductive type semiconductor layer 110 to perform an etching process along the pattern mask, thereby forming the light extraction pattern 111 having specific shape and arrangement.

Then, a first electrode 115 may be formed on a portion of the top surface of the first conductive type semiconductor layer 110. The first electrode 115 may be formed of a metal, e.g., at least one of Cr, Ni, Au, Ti, and Al.

The first electrode 115 may be formed using one of an E-beam deposition process, a physical vapor deposition (PVD) process, a chemical vapor deposition (CVD) process, a plasma laser deposition (PLD) process, a dual-type thermal evaporator process, and a sputtering process.

Figure 20:
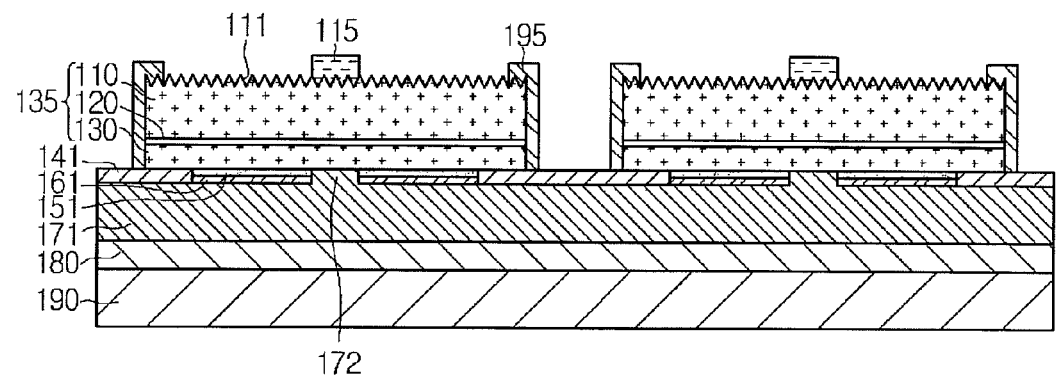

Referring to FIG. 20, an insulation layer 195 may be formed on a side surface of the light emitting structure layer 135 and the first conductive type semiconductor layer 110. Although the insulation layer 195 is formed on a portion of the top surface of the first conductive type semiconductor layer 110 in the current embodiment, the insulation layer 195 may be formed on an area except the area on which the first electrode 115 is formed. The insulation layer 195 may be formed of an insulating and light-transmitting material, e.g., one of $SiO_2$, $SiO_x$, $SiO_xN_y$, $Si_3N_4$, and $Al_2O_3$.

The insulation layer 195 may be formed using the E-beam deposition process, the sputtering process, or the plasma enhanced chemical vapor deposition (PECVD) process.

The light extraction pattern 111 and the insulation layer 195 may vertically and at least partially overlap each other. Also, the light extraction pattern 111 and the insulation layer 195 may be formed on the area except the area on which the first electrode 115 is formed above the first conductive type semiconductor layer 130. Thus, it may prevent the insulation layer 195 and the first conductive type semiconductor layer 110 from being easily separated from each other to improve reliability of the light emitting device.

According to the current embodiment, when the growth substrate 105 is formed of silicon, the light emitting structure layer 135 including the first conductive type semiconductor layer 110, an active layer 120, and the second conductive type semiconductor layer 130 may be stacked on the growth substrate. Also, when the Si growth substrate 105 is separated using the wet etching process after the plurality of conductive layers 151, 161, 171, and 180 and the support member 190 adhere to each other, cracks may occur in the light emitting structure layer 135. As a result, the light emitting structure layers 135 may be mismatched with each other. However, when the support member 190 is formed of the insulating material, it may prevent the cracks from occurring to improve yield of the light emitting device.

A chip separation process for dividing the light emitting device into individual device units may be realized through a laser scribing process. In this case, when the support member 190 is formed of a conductive material such as a metal, the support member 190 may be melted by heat of a laser to generate burrs, thereby deteriorating the reliability of the device. However, according to the current embodiment, when the support member 190 is formed of the insulating material, the above-described limitation such as the occurrence of the burrs may be solved.

Figure 21:
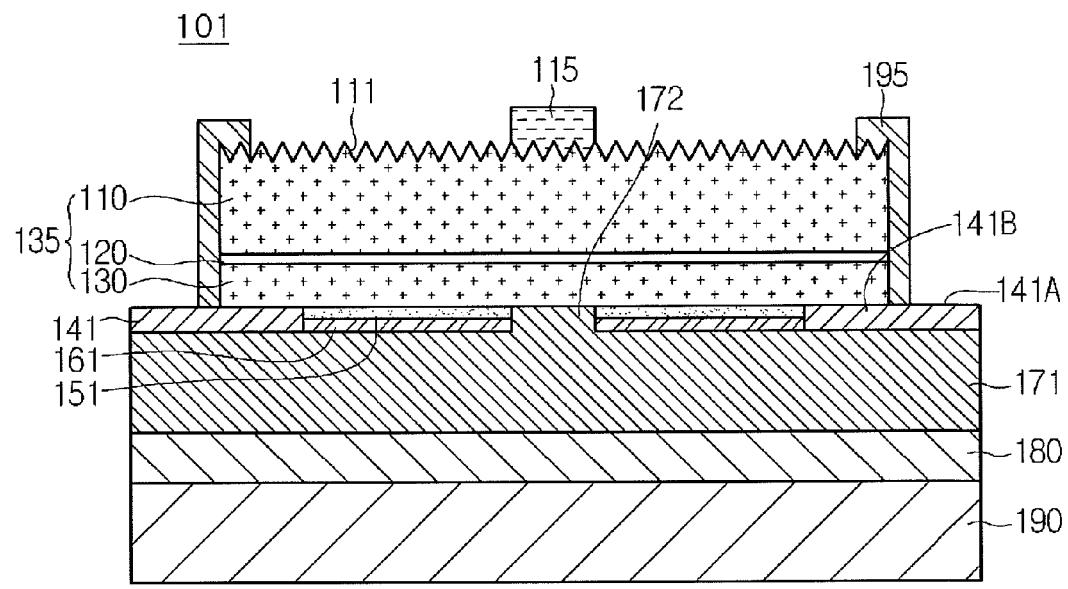

Referring to FIG. 21, a chip separation process for dividing the light emitting device of FIG. 20 into individual light emitting device units may be performed to provide the light emitting device 101 according to the current embodiment.

For example, the chip separation process may be performed by using a breaking process in which a physical force is applied using a blade to separate a chip, a laser scribing process in which a chip boundary is irradiated with a laser to separate a chip, and an etching process including a wet or dry etching process, but is not limited thereto.

Figure 22:
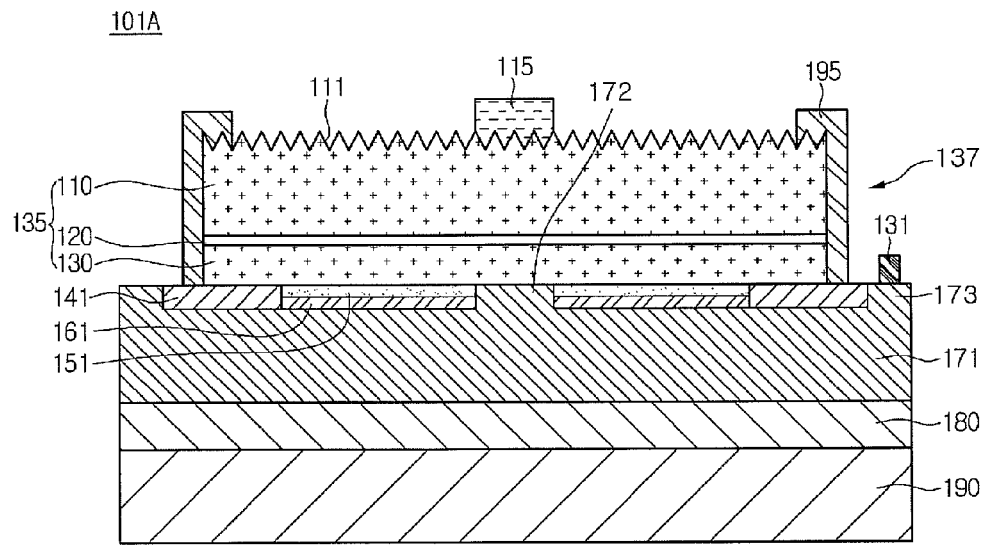
FIG. 22 is a sectional view of a light emitting device according to a fifth embodiment.

FIG. 22 is a sectional view of a light emitting device 101A according to a fifth embodiment.

Referring to FIG. 22, the light emitting device 101A may include a first electrode 115, a second electrode 131, a light emitting structure layer 135, a first conductive layer 151, a second conductive layer 152, a third conductive layer 171 including a first contact layer 172 and a second contact layer 173, a fourth conductive layer 180, and a support member 190.

The third conductive layer 171 includes the first contact layer 172 and the second contact layer 173. The first contact layer 172 may correspond to the first electrode 115 in a thickness direction of the light emitting structure layer 135 and serve as a current blocking layer. The second contact layer 173 may be disposed around a lower surface of the light emitting structure layer 135. Also, the second contact layer 173 may be disposed further outward from a sidewall 137 of the light emitting structure layer 135 and a side surface of an insulation layer 195. A top surface of the second contact part 173 of the third conductive layer 171 may be exposed. Also, the second electrode 131 may be disposed on the top surface of the second contact part 173, or a wire may be directly bonded to the top surface of the second contact part 173. The second electrode 131 may be formed of a metal, e.g., at least one of Cr, Ni, Au, V, W, Ti, and Al. Also, the second electrode 131 may supply a power to a second conductive type semiconductor layer 130.

The top surface of the second contact part 173 on an edge of the third conductive layer 171 may be spaced from the sidewall 137 of the light emitting structure layer 135.

The second electrode 131 may be electrically connected to the second conductive type semiconductor layer 130 by the third conductive layer 171 to supply a power to the second conductive type semiconductor layer 130. The wire may be bonded to the second electrode 131.

The second electrode 131 may be electrically connected to the light emitting structure layer 135 and the first and second conductive layers 151 and 161. A power supplied into the second electrode 131 may be supplied into the first and second conductive layers 151 and 162 through the third conductive layer 171. The second electrode 131 may be disposed on at least one side surface of side surfaces of the light emitting structure layer 135 or extend in a pattern shape and thus disposed on at least two side surfaces.

The protection member 141 may be disposed between the first and second contact parts 172 and 173 of the third conductive layer 171. Alternatively, the protection member 141 may be disposed between the second contact part 172 and the first conductive layer 151 or/and the second conductive layer 161. The protection member 141 may physically contact the second conductive type semiconductor layer, the first conductive layer 151, the second conductive layer 161, and a third conductive layer 171.

Figure 23:
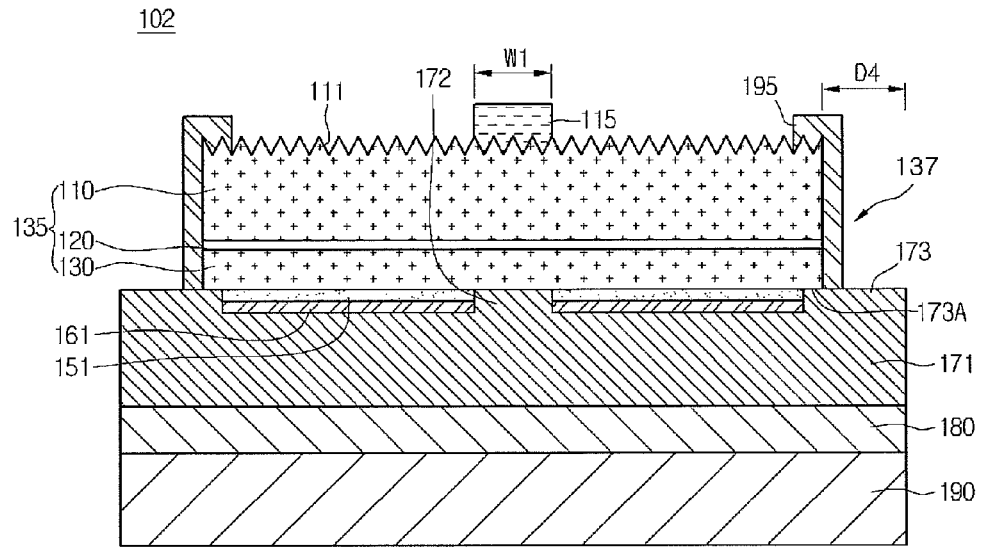
FIG. 23 is a side sectional view of a light emitting device according to a sixth embodiment.

FIG. 23 is a side sectional view of a light emitting device 102 according to a sixth embodiment.

Referring to FIG. 23, the light emitting device 102 may include a first electrode 115, a light emitting structure layer 135, a first conductive layer 151, a second conductive layer 161, a third conductive layer 170 including a first contact layer 171 and a second contact layer 173, a fourth conductive layer 180, and a support member 190.

The light emitting structure layer 135 may include a first conductive type semiconductor layer 110, an active layer 120, and a second conductive type semiconductor layer 130. Here, electrons and holes supplied from the first and second conductive type semiconductor layers 110 and 130 may be recombined with each other in the active layer 120 to generate light.

The support member 190 may include an insulating support member or a conductive support member and support the light emitting structure layer 135. The support member 190 may be formed of a material having insulating properties, e.g., at least one material of $SiO_2$, SiC, $SiO_x$, $SiO_xN_y$, $TiO_2$, and $Al_2O_3$. Also, the support member 190 may be formed of a material having a specific resistance of about $1 \times 10^{-4}$ Ω/cm or more. Alternatively, the support member 190 may be formed of a material having conductivity, e.g., at least one of copper (Cu), gold (Au), nickel (Ni), molybdenum (Mo), copper-tungsten (Cu—W), and carrier wafers such as Si, Ge, GaAs, GaN, ZnO, Sic, SiGe, etc.

The fourth conductive layer 180 may be disposed on the support member 190. The fourth conductive layer 180 may serve as a bonding layer and be disposed between the support member 190 and the third conductive layer 171 to enhance an adhesion therebetween. The fourth conductive layer 180 may include a barrier metal layer or a bonding metal layer. For example, the fourth conductive layer 180 may be formed of at least one of Ti, Au, Sn, Ni, Cr, Ga, Nb, In, Bi, Cu, Al, Si, Ag, and Ta.

The third conductive layer 171 may be disposed on the fourth conductive layer 180. A first contact part 172 of the third conductive layer 171 may contact the second conductive type semiconductor layer 130. Also, the first contact part 172 may serve as an electrode or bonding pad of the second conductive type semiconductor layer 130 to supply a power into the second conductive type semiconductor layer 130.

The first contact part 172 of the third conductive layer 171 may vertically overlap the first electrode 115. Also, the first contact part 172 may physically or/and electrically contact the lowermost layer of the light emitting structure layer 135, e.g., a lower surface of the second conductive type semiconductor layer 130 through the first and second conductive layers 151 and 161.

The third conductive layer 171 may be formed of at least one of Ni, Pt, Ti, W, V, Fe, and Mo. Also, the third conductive layer 171 may be formed as a single or multi layer.

The third conductive layer 171 may radiate heat generated in the light emitting structure layer 135 to prevent the light emitting device from be deteriorated in reliability. Also, the third conductive layer 171 may have a thickness of about 0.1 μm to about 200 μm. The third conductive layer 171 may serve as a heat radiating plate for releasing heat and an electrode for supplying a power under the light emitting structure layer 135. The first contact part 172 of the third conductive layer 171 may contact the light emitting structure layer 135 with a contact resistance greater than that of the first conductive layer 151.

The second contact part 173 of the third conductive layer 171 may protrude further outward from a sidewall 137 of the light emitting structure layer 135. Also, a wire or a second electrode may contact the second contact part 173. A portion 173A of the second contact part 173 may contact an edge of a lower surface of the second conductive type semiconductor layer 130, but is not limited thereto.

A distance D4 between a side surface of the third conductive layer 171 and the sidewall 137 of the light emitting structure layer 135 may be greater than a thickness of an insulation layer 195. Thus, a top surface of the second contact part 173 may be exposed.

The second conductive layer 161 may be disposed on the third conductive layer 171. The second conductive layer 161 may include a reflective layer. Also, the second conductive layer 161 may be formed a metallic material having a reflective index of about 50% or more, and thus may have various reflective indexes according to characteristics of the metallic material. The second conductive layer 161 may reflect light incident from the light emitting structure layer 135 to improve light emitting efficiency of the light emitting device.

For example, the second conductive layer 161 may be formed of a metal or alloy including at least one of Ag, Ni, Al, Rh, Pd, Ir, Ru, Mg, Zn, Pt, Au, and Hf. Alternatively, the second conductive layer 160 may be formed as a multi layer using the metal or alloy and a light-transmitting conductive material such as ITO, IZO, IZTO, IAZO, IGZO, IGTO, AZO, or ATO. For example, the second conductive layer 160 may have a stacked structure such as IZO/Ni, AZO/Ag, IZO/Ag/Ni, AZO/Ag/Ni, Ag/Cu, or Ag/Pd/Cu.

The first conductive layer 151 may be disposed on the second conductive layer 161. The first conductive layer 151 makes ohmic contact with the second conductive type semiconductor layer 130 to smoothly supply a power into the light emitting structure layer 135.

A light-transmitting conductive layer and a metal may be selectively used as the first conductive layer 151. For example, the first conductive layer 150 may be realized as a single or multi layer by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Pt, In, Zn, and Sn.

The light emitting structure layer 135 may be disposed on the first conductive layer 151.

The light emitting structure layer 135 may include a compound semiconductor layer including group III-V elements, e.g., the first conductive type semiconductor layer 110, the active layer 120 under the first conductive type semiconductor layer 110, and the second conductive type semiconductor layer 130 under the active layer 120.

The light emitting structure layer 135 may have inclined side surfaces through an isolation etching process for dividing a plurality of chips into individual unit chips.

A light extraction pattern 111 may be disposed on the top surface of the light emitting structure layer 135. The light extraction pattern 111 may minimize an amount of light totally reflected by a surface thereof to improve the light extraction efficiency of the light emitting device. The light extraction pattern 111 may have a random shape and arrangement or a specific shape and arrangement.

The first electrode 115 may be disposed on a top surface of the light emitting structure layer 135. The first electrode 115 may be branched in a predetermined pattern shape, but is not limited thereto. Also, the first electrode 115 may have a structure in which at least one pad and an electrode pattern having at least one shape and connected to the pad are equally or differently stacked with each other, but is not limited thereto. The first electrode 115 may be formed of a metal, e.g., at least one of Cr, Ni, Au, V, W, Ti, and Al. Also, the first electrode 115 may supply a power to the first conductive type semiconductor layer 110.

Hereinafter, a method for fabricating the light emitting device according to the sixth embodiment will be described in detail. However, duplicate descriptions, which have been described already in the previous exemplary embodiment, will be omitted or described briefly.

FIGS. 24 to 31 are views of a process for fabricating a light emitting device according to the sixth embodiment.

Figure 24:
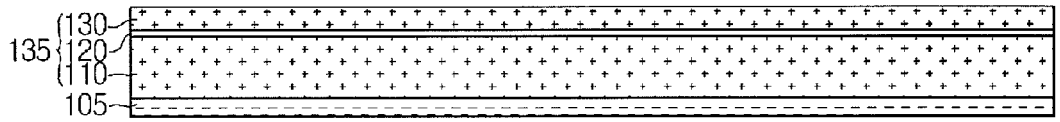
FIGS. 24 to 31 are views of a process for fabricating the light emitting device according to the sixth embodiment.

Referring to FIG. 24, a light emitting structure layer 135 may be formed on a growth substrate 105.

For example, the growth substrate 105 may be formed of at least one of sapphire ($Al_2O_3$), SiC, GaAs, GaN, ZnO, Si, GaP, InP, and Ge, but is not limited thereto. In the current embodiment, a silicon (Si) substrate is exemplified as the growth substrate.

The light emitting structure layer 135 may include a first conductive type semiconductor layer 110, an active layer 120, and a second conductive type semiconductor layer 130. A buffer layer (not shown) may be formed between the first conductive type semiconductor layer 110 and the growth substrate 105 to reduce a lattice constant difference therebetween.

Figure 25:
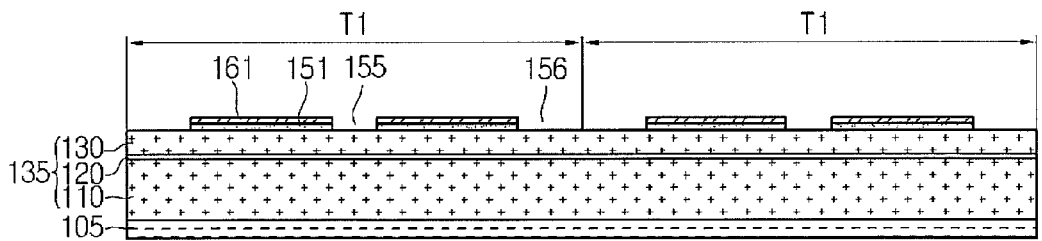

Referring to FIG. 25, a first conductive layer 151 may be formed on the second conductive type semiconductor layer 130, and a second conductive layer 161 may be formed on the first conductive layer 151. The first and second conductive layers 151 and 161 may be formed on a portion of the second conductive type semiconductor layer 130. Also, a hole 155 may be defined in an area at which the first and second conductive layers 151 and 161 at least partially and vertically overlap an area on which a first electrode will be formed later. Also, a hole 156 may be further defined in a boundary of a first distance T1 between the first and second conductive layers 151 and 161.

Figure 26:
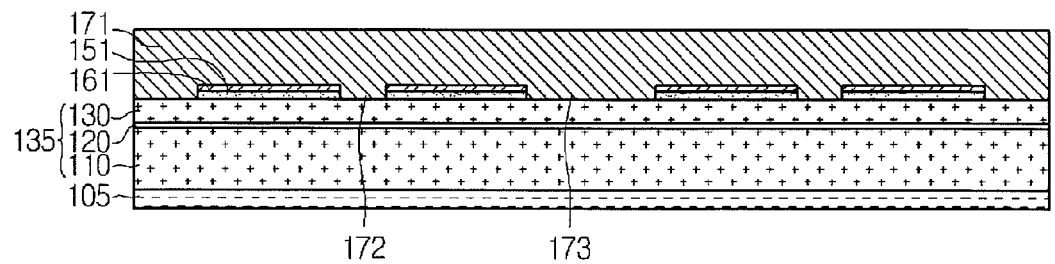

Referring to FIGS. 25 and 26, a third conductive layer 171 may be formed on the second conductive type semiconductor layer 130 and the second conductive layer 161. The third conductive layer 171 may cover the first conductive layer 151 and the second conductive layer 161. Also, first and second contact parts 172 and 173 may be disposed in the holes 155 and 156 in which the first and second conductive layers 151 and 161 are not formed to contact the second conductive type semiconductor layer 130. The second contact part 173 of the third conductive layer 171 may be formed on the boundary of the first distance T1.

Figure 27:
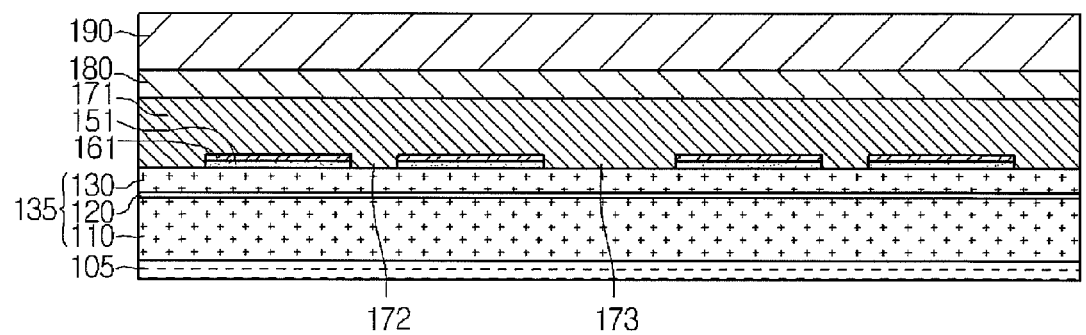

Referring to FIG. 27, a fourth conductive layer 180 may be formed on the third conductive layer 171, and a support member 190 may be formed on the fourth conductive layer 180. The fourth conductive layer 180 may be formed between the third conductive layer 171 and the support member 190 to enhance an adhesion therebetween. The support member 190 may be prepared as a separate sheet. The support member 190 may adhere to the fourth conductive layer 180 through a bonding process or be deposited on the fourth conductive layer 180 through a deposition process, but is not limited thereto.

Figure 28:
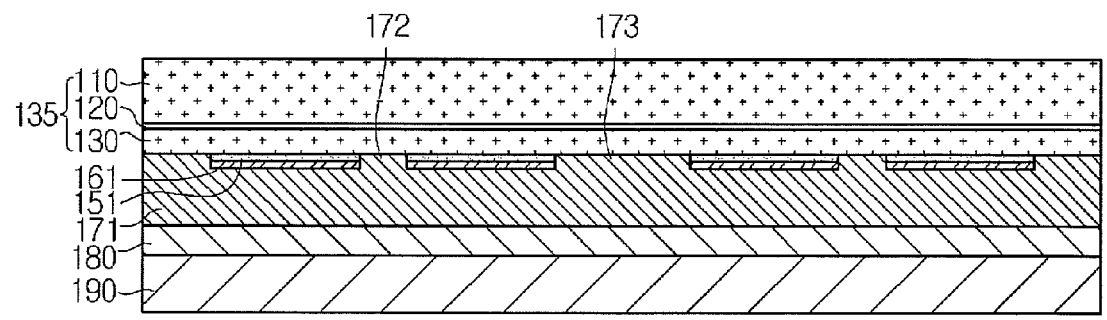

Referring to FIG. 28, the growth substrate 105 may be removed from the light emitting device of FIG. 27. The growth substrate 105 may be removed by an etching process. As the growth substrate 105 is removed, a surface of the first conductive type semiconductor layer 110 may be exposed.

Figure 29:
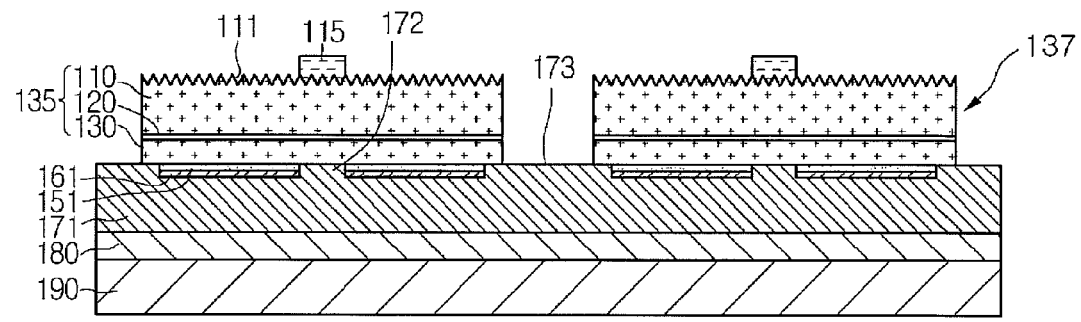

Referring to FIG. 29, an isolation etching process may be performed on the light emitting structure layer 135 along a unit chip region to divide the light emitting structure layer 135 into a plurality of light emitting structure layers 135. Although the light emitting structure layer 135 has a vertical side surface in the current embodiment, the light emitting structure layer 135 may have an inclined side surface by the isolation etching process. Also, the second contact part 173 of the third conductive layer 171 may be exposed by the isolation etching process.

A light extraction pattern 111 may be formed on a top surface of the first conductive type semiconductor layer 110.

Then, a first electrode 115 may be formed on a portion of the top surface of the first conductive type semiconductor layer 110. The first electrode 115 may be formed of a metal, e.g., at least one of Cr, Ni, Au, Ti, and Al.

Figure 30:
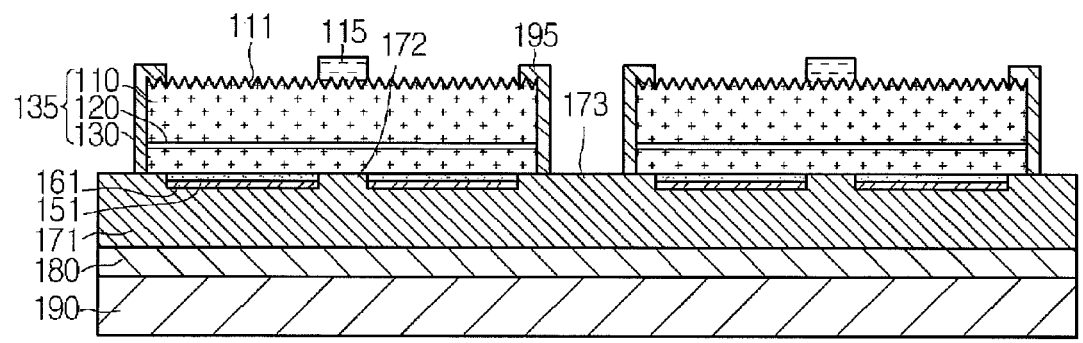

Referring to FIG. 30, an insulation layer 195 may be formed on a side surface of the light emitting structure layer 135 and the first conductive type semiconductor layer 110. Although the insulation layer 195 is partially formed on the top surface of the first conductive type semiconductor layer in the current embodiment, the insulation layer 195 may be fanned on the entire area except the area on which the first electrode 115 is formed. The insulation layer 195 may be formed of an insulating and light-transmitting material, e.g., one of $SiO_2$, $SiO_x$, $SiO_xN_y$, $Si_3N_4$, and $Al_2O_3$.

The insulation layer 195 may be disposed on the light extraction pattern 111. Thus, it may prevent the insulation layer 195 and the first conductive type semiconductor layer 110 from being easily separated from each other to improve reliability of the light emitting device.

Figure 31:
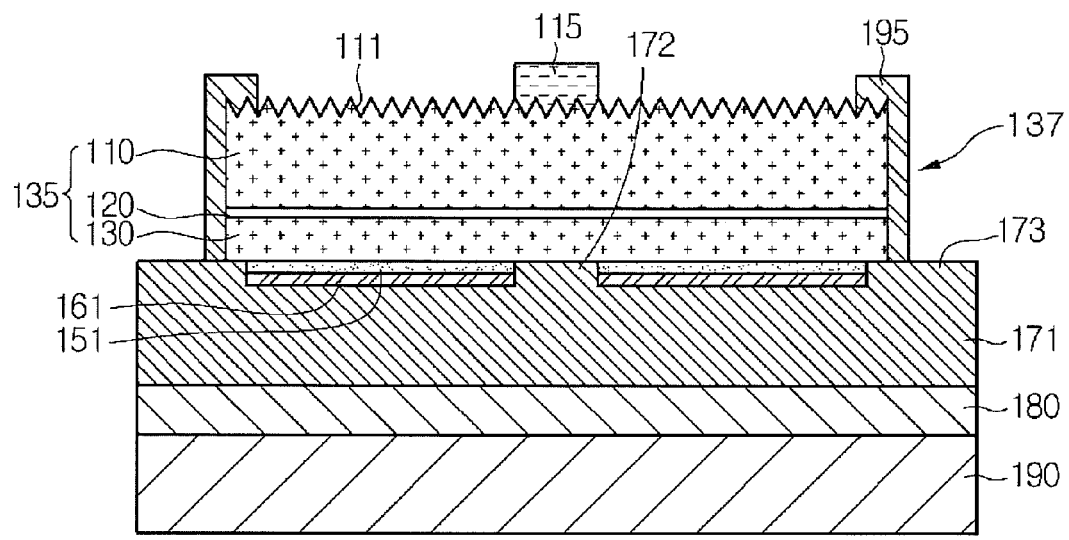

Referring to FIG. 31, a chip separation process for dividing the light emitting device of FIG. 30 into individual light emitting device units may be performed to provide the light emitting device 102 according to the current embodiment.

For example, the chip separation process may be performed by using a breaking process in which a physical force is applied using a blade to separate a chip, a laser scribing process in which a chip boundary is irradiated with a laser to separate a chip, and an etching process including a wet or dry etching process, but is not limited thereto.

According to the fabrication processes of FIGS. 24 to 31, when the growth substrate is formed of silicon, the light emitting structure layer 135 including the first conductive type semiconductor layer 110, the active layer 120, and the second conductive type semiconductor layer 130 may be stacked on the growth substrate 105, and then the support member 190 may be coupled thereto. Then, when the Si growth substrate 105 is removed by the wet etching process, cracks may occur in the light emitting structure layer 105. Thus, the light emitting structure layers 105 may be mismatched with each other. In the current embodiment, when the support member 105 is formed of an insulating material, the occurrence of the cracks may be prevented to provide the light emitting device having the improved reliability.

Also, the chip separation process for dividing the light emitting device into individual device units may be realized through a laser scribing process. Here, when the support member 190 is formed of a conductive material such as a metal, the support member 190 may be melted by heat of a laser to generate burrs, thereby deteriorating the reliability of the device. However, according to the current embodiment, when the support member 190 is formed of the insulating material, the above-described limitation such as the occurrence of the burrs may be solved.

Figure 32:
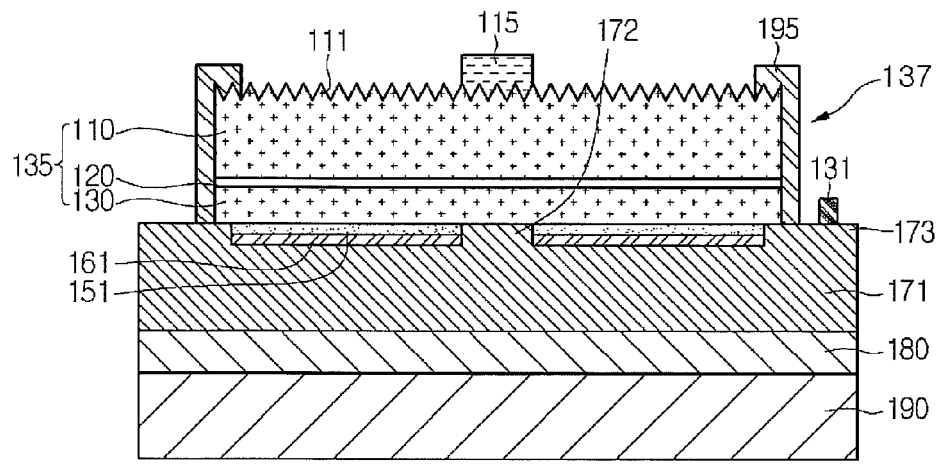
FIG. 32 is a side sectional view of a light emitting device according to a seventh embodiment.

FIG. 32 is a sectional view of a light emitting device according to the seventh embodiment.

Referring to FIG. 32, a light emitting device 102A may include a first electrode 115, a second electrode 131, a light emitting structure layer 135, a first conductive layer 151, a second conductive layer 152, a third conductive layer including a first contact layer 171, a fourth conductive layer 180, and a support member 190.

The second electrode 131 may be disposed on a second contact part 173 of the third conductive layer 171 and spaced from the light emitting structure layer 135.

The second electrode 131 may physically contact the third conductive layer 171 and be electrically connected to a second conductive type semiconductor layer 130 to supply a power the second conductive type semiconductor layer 130. A wire may be bonded to the second electrode 131.

The second electrode 131 may be spaced from a sidewall 137 of the light emitting structure layer 135. Also, the second electrode 131 may be electrically connected to the first and second conductive layers 151 and 161. The power supplied into the second electrode 131 may be supplied into the first and second conductive layers 151 and 161 through the third conductive layer 171. The second electrode 131 may be disposed on at least one side surface of side surfaces of the light emitting structure layer 135 or extend in a pattern shape and thus disposed on the plurality of side surfaces.

Figure 33:
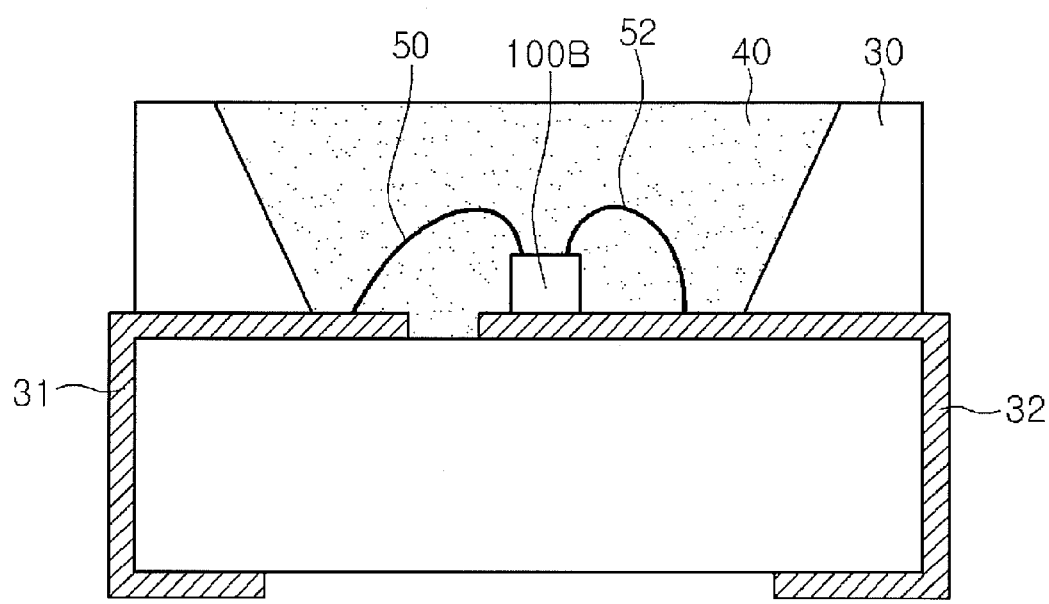
FIG. 33 is a sectional view of a light emitting device package including the light emitting device according to the embodiments.

FIG. 33 is a sectional view of a light emitting device package including the light emitting device according to the embodiments. In FIG. 33, a package of the light emitting device according to the second embodiment will be described as an example.

Referring to FIG. 33, a light emitting device package 200 includes a body 20, first and second lead electrodes 31 and 32 disposed on the body 20, a light emitting device 100B disposed on the body 20 and electrically connected to the first and second lead electrodes 31 and 32, a molding member 40 surrounding the light emitting device 100B, a first wire 50, and a second wire 52.

The body 20 may be formed of a silicon material, a synthetic resin material, or a metal material. An inclined surface may be disposed around the light emitting device 100B.

The first lead electrode 31 and the second lead electrode 32 are electrically separated from each other and supply a power to the light emitting device 100B. Also, the first lead electrode 31 and the second lead electrode 32 may reflect light generated in the light emitting device 100B to improve light efficiency and may radiate heat generated in the light emitting device 100B to the outside.

The light emitting device 100B may be disposed on the body 20 or the first or second lead electrode 31 or 32.

The light emitting device 100B may be electrically connected to the first and second lead electrodes 31 and 32 through one of a wiring process, a flip-chip process, and a die bonding process. The first wire 50 may connect the first lead electrode 31 to the first electrode 115 of FIG. 1, and the second wire 52 may be bonded to the second lead electrode 32 on a top surface of an edge of the third conductive layer 170 of FIG. 1 or bonded on the second electrode 131 of FIG. 11.

The molding member 40 may surround the light emitting device 100B to protect the light emitting device 100B. The molding member 40 may include a phosphor to vary a wavelength of light emitted form the light emitting device 100B. A lens may be disposed on the molding member 40. The lens may have a concave lens shape or a convex lens shape.

The light emitting device package according to the embodiments may be provided in plurality on a board, and the plurality of light emitting device packages may be arranged on the board. Also, optical members such as a light guide plate, a prism sheet, a diffusion sheet, and a fluorescent sheet may be disposed in a path of light emitted from the light emitting device package. The light emitting device package, the board, and the optical members may function as a backlight unit or a lighting unit. For example, a lighting system may include backlight units, lighting units, indicating devices, lamps, and street lamps.

Figure 34:
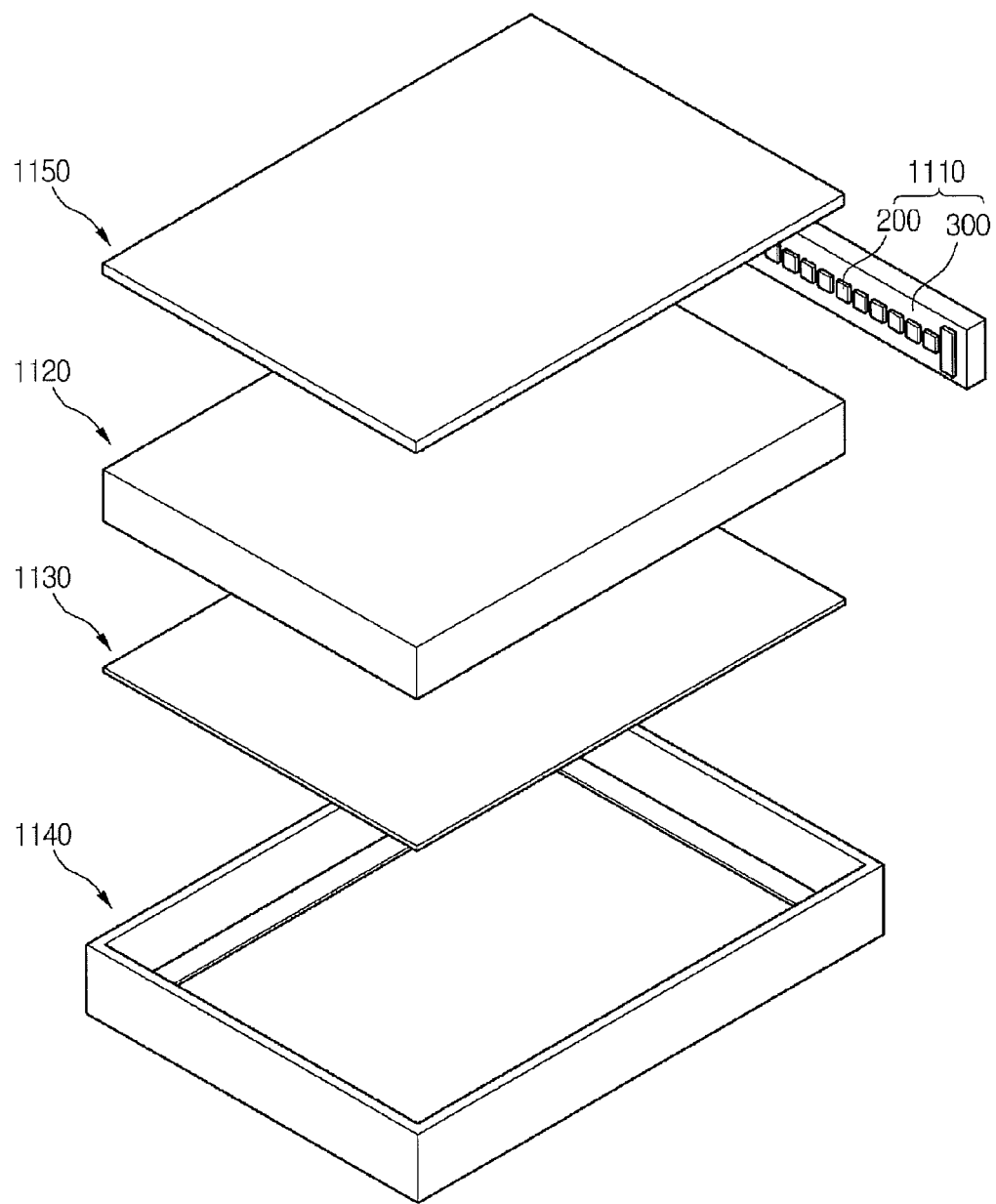
FIG. 34 is a view of a backlight unit including the light emitting device package according to the embodiments.

FIG. 34 is a view of a backlight unit including the light emitting device package according to the embodiments. However, a backlight unit 1100 of FIG. 34 is described as an example of the lighting system. Thus, the present disclosure is not limited thereto.

Referring to FIG. 34, the backlight unit 1100 may include a bottom frame 1140, a light guide member 1120 disposed within the bottom frame 1140, and a light emitting module 1110 disposed on at least one side or a lower surface of the light guide member 1120. Also, a reflective sheet 1130 may be disposed under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a board 300 and a plurality of light emitting device packages 200 mounted on the board 300. The plurality of light emitting device packages 200 may provide light to the light guide member 1120.

As shown in FIG. 34, the light emitting module 1110 may be disposed on at least one of inner surfaces of the bottom frame 1140. Thus, the light emitting module 1110 may provide light toward at least one side surface of the light guide member 1120.

However, the light emitting module 1110 may be disposed under the bottom frame 1140 to provide light toward the under surface of the light guide member 1120. Since this structure may be variously varied according to a design of the backlight unit 1100, the present disclosure is not limited thereto.

The light guide member 1120 may be disposed within the bottom frame 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethyl methacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescent sheet. For example, the diffusion sheet, the light collection sheet, the brightness enhancement sheet, and the fluorescent sheet may be stacked to form the optical sheet 1150. In this case, the diffusion sheet 1150 may uniformly diffuse light emitted from the light emitting module 1110, and the diffused light may be collected into the display panel (not shown) by the light collection sheet.

Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light transmitting plate or film including a phosphor.

The reflective sheet 1130 may be disposed under the light guide member 1120. The reflective sheet 1130 reflects the light emitted through the lower surface of the light guide member 1120 toward a light emission surface of the light guide member 1120.

The reflective sheet 1130 may be formed of a material having superior reflectance, e.g., a PET resin, a PC resin, or a PVC resin, but is not limited thereto.

Figure 35:
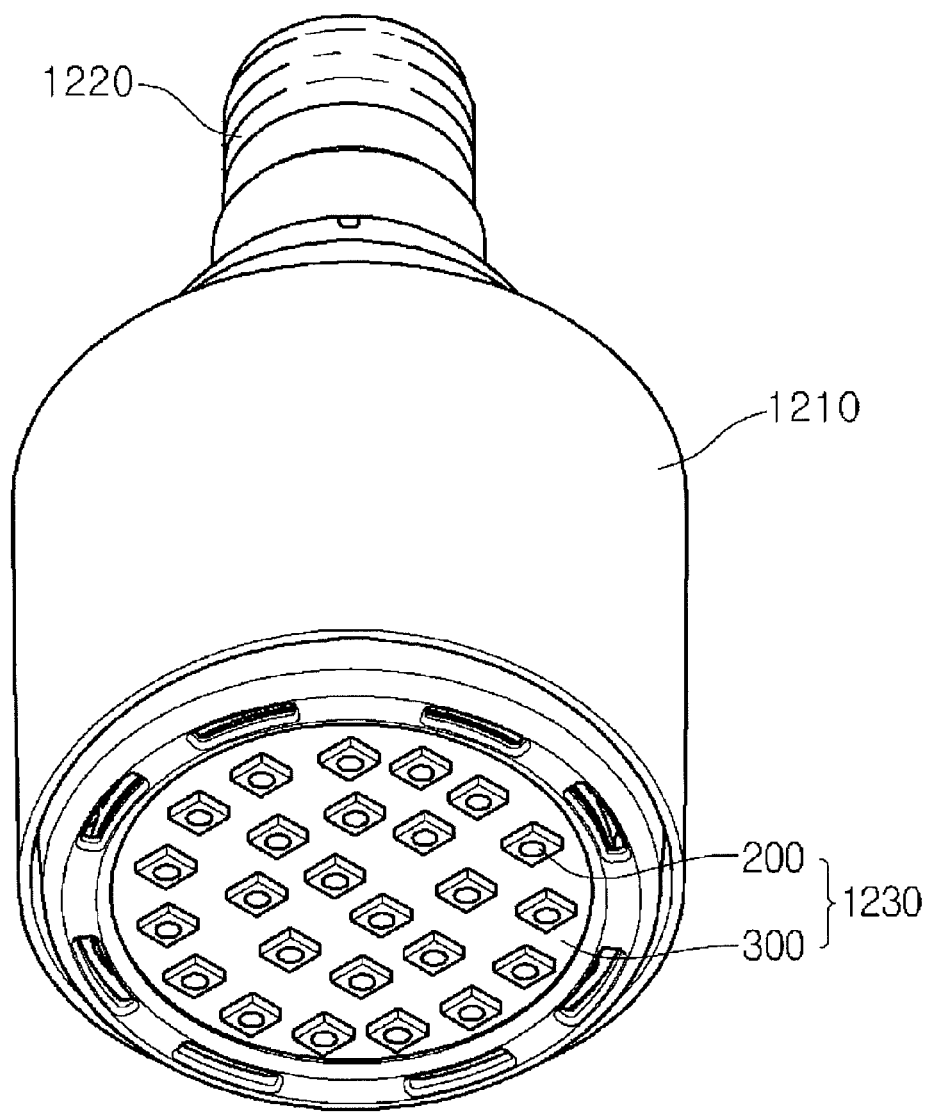
FIG. 35 is a perspective view of a lighting unit including the light emitting device package according to the embodiments.

FIG. 35 is a perspective view of a lighting unit including the light emitting device package according to the embodiments. However, a lighting unit 1200 of FIG. 35 is described as an example of the lighting system. Thus, the present disclosure is not limited thereto.

Referring to FIG. 35, the lighting unit 1200 may include a case body 1210, a light emitting module 1230 disposed on the case body 1210, and a connection terminal 1220 disposed on the case body 1210 to receive a power from an external power source.

The case body 1210 may be formed of a material having good thermal dissipation properties, e.g., a metal material or a resin material.

The light emitting module 1230 may include a board 300 and at least one light emitting device package 200 mounted on the board 300.

A circuit pattern may be printed on a dielectric to manufacture the board 300. For example, the board 300 may include a printed circuit board (PCB), a metal core PCB, a flexible PCB, and a ceramic PCB. Also, the board 300 may be formed of a material which may effectively reflect light or have a color by which light is effectively reflected, e.g., a white color or a silver color.

The at least one light emitting device package 200 according to the embodiments may be mounted on the board 300. The light emitting device package 200 may include at least one light emitting diode (LED). The LED may include color LEDs, which respectively emit light having a red color, a green color, a blue color, and a white color and an ultraviolet (UV) LED emitting UV rays.

The light emitting module 1230 may have various combinations of the LEDs to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet may change a wavelength of light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. The connection terminal 1220 may be screwed and coupled to an external power source in a socket type, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain desired optical effects.

As described above, the lighting system according to the embodiments includes the light emitting device package according to the embodiments to improve the light efficiency.

The embodiments provide the light emitting device having a new structure, the method for fabricating the light emitting device, the light emitting device package, and the lighting system.

The embodiments provide the light emitting device having the improved reliability, the method for fabricating the light emitting device, a light emitting device package, and a lighting system.

The embodiments provide the method for fabricating the light emitting device, which can prevent the wafer align from being mismatched with each other.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure layer comprising a first conductive type semiconductor layer, a second conductive type semiconductor layer, and an active layer between the first conductive type semiconductor layer and the second conductive type semiconductor layer;
   a first electrode electrically connected to the first conductive type semiconductor layer;
   an insulating support member under the light emitting structure layer;
   a plurality of conductive layers between the light emitting structure layer and the insulating support member;
   a second electrode disposed on a top surface of one of the plurality of conductive layers and connected to the plurality of conductive layers,
   wherein at least one of the plurality of conductive layers has a width greater than that of the light emitting structure layer and comprises a contact part disposed further outward from a sidewall of the light emitting structure layer,
   wherein the second electrode is disposed further outward from a sidewall of the light emitting structure layer and is located at a higher position than a top surface of the insulating support member, and
   wherein the plurality of conductive layers and the second electrode are electrically connected to the second conductive type semiconductor layer.

2. The light emitting device according to claim 1, wherein the at least one of the plurality of conductive layers makes ohmic contact with a lower surface of the second conductive type semiconductor layer.

3. The light emitting device according to claim 1, wherein another of the plurality of conductive layers makes schottky contact with a lower surface of the second conductive type semiconductor layer.

4. The light emitting device according to claim 2, further comprising a current blocking layer between the light emitting structure layer and the plurality of conductive layers.

5. The light emitting device according to claim 4, wherein the first electrode is disposed on the light emitting structure layer and the current blocking layer vertically corresponds to a portion of the first electrode.

6. The light emitting device according to claim 4, wherein the first electrode is disposed on the light emitting structure layer, the current blocking layer has a hole in an area vertically corresponding to the first electrode, and one of the plurality of conductive layers is disposed in the hole of the current blocking layer.

7. The light emitting device according to claim 1, wherein the plurality of conductive layers comprise a first conductive layer being ohmic contact with a lower surface of the light emitting structure layer, a second conductive layer disposed between the first conductive layer and the insulating support member to reflect light, a third conductive layer disposed between the second conductive layer and the insulating support member to radiate heat, and a fourth conductive layer disposed between the third conductive layer and the insulating support member.

8. The light emitting device according to claim 7, further comprising a second electrode on at least one contact part of the plurality of conductive layers.

9. The light emitting device according to claim 8, wherein the at least one of the plurality of conductive layers has a width greater than that of each of the first and second conductive layers.

10. The light emitting device according to claim 8, wherein the at least one of the plurality of conductive layers comprises the first conductive layer or the third conductive layer.

11. The light emitting device according to claim 7, further comprising: an insulation layer contacted with the sidewall of the light emitting structure layer,
    wherein the contact part is protruded from the third conductive layer and includes an inner portion overlapped with a periphery region of a lower surface of the insulation layer and the light emitting structure layer.

12. The light emitting device according to claim 11, further comprising: a protection member contacted between a lower surface of the light emitting structure layer and a top surface of the third conductive layer,
    wherein the protection member is disposed between the first conductive layer and the contact part of the third conductive layer.

13. The light emitting device according to claim 1, wherein the plurality of conductive layers comprise a first conductive layer being ohmic contact with the light emitting structure layer, a second conductive layer disposed between the first conductive layer and the insulating support member, a third conductive layer disposed between the second conductive layer and the insulating support member, and a fourth conductive layer disposed between the third conductive layer and the insulating support member.

14. The light emitting device according to claim 13, wherein the third conductive layer comprises a second contact part disposed further outward from a sidewall of the light emitting structure layer.

15. A light emitting device comprising:
- a light emitting structure layer comprising a first conductive type semiconductor layer, a second conductive type semiconductor layer under a lower surface of the first conductive type semiconductor layer, and an active layer between the first conductive type semiconductor layer and the second conductive type semiconductor layer;
- a first electrode electrically connected to the first conductive type semiconductor layer;
- an insulating support member under the light emitting structure layer;
- a plurality of conductive layers between a lower surface of the light emitting structure layer and a top surface of the insulating support member;
- a second electrode disposed on a top surface of one of the plurality of conductive layers and connected to the plurality of conductive layers; and
- a protection member between the lower surface of the light emitting structure layer and the top surface of the insulating support member,
- wherein at least one of the plurality of conductive layers has a width greater than that of the light emitting structure layer and comprises a first contact part corresponding to the first electrode,
- wherein the second electrode is disposed further outward from a sidewall of the light emitting structure layer and is located at a higher position than the top surface of the insulating support member, and
- wherein the plurality of conductive layers and the second electrode are electrically connected to the second conductive type semiconductor layer.

16. The light emitting device according to claim 15, wherein the plurality of conductive layers comprise a first conductive layer being ohmic contact with the light emitting structure layer, a second conductive layer disposed between the first conductive layer and the insulating support member to reflect light, a third conductive layer disposed between the second conductive layer and the insulating support member, and a fourth conductive layer disposed between the third conductive layer and the insulating support member.

17. The light emitting device according to claim 16, wherein the third conductive layer comprises a second contact part disposed further outward from a sidewall of the light emitting structure layer.

18. The light emitting device according to claim 17, wherein the third conductive layer comprises the first contact part and the second contact part,
wherein the first contact part is contacted with the lower surface of the light emitting structure layer.

19. The light emitting device according to claim 18, wherein the second electrode is disposed on the second contact part of the third conductive layer.

20. The light emitting device according to claim 18, wherein the protection member is disposed between the first and second contact parts of the third conductive layer.

21. The light emitting device according to claim 18, wherein the first and second conductive layers are disposed between the first and second contact parts of the third conductive layer.

22. The light emitting device according to claim 15, further comprising: an insulation layer around the light emitting structure layer; and a light extraction pattern on a top surface of the first conductive type semiconductor layer.

* * * * *